(12) United States Patent
Tsuchi

(10) Patent No.: US 11,341,886 B2
(45) Date of Patent: *May 24, 2022

(54) DIGITAL-TO-ANALOG CONVERTER CIRCUIT AND DATA DRIVER

(71) Applicant: LAPIS Semiconductor Co., Ltd., Yokohama (JP)

(72) Inventor: Hiroshi Tsuchi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/099,299

(22) Filed: Nov. 16, 2020

(65) Prior Publication Data

US 2021/0074198 A1 Mar. 11, 2021

Related U.S. Application Data

(63) Continuation of application No. 16/800,909, filed on Feb. 25, 2020, now Pat. No. 10,867,541.

(30) Foreign Application Priority Data

Mar. 12, 2019 (JP) ................ JP2019-45062

(51) Int. Cl.
*G09G 3/20* (2006.01)
*H03M 1/66* (2006.01)
(52) U.S. Cl.
CPC ............... *G09G 3/20* (2013.01); *H03M 1/66* (2013.01); *G09G 2300/0828* (2013.01); *G09G 2310/027* (2013.01); *G09G 2310/0291* (2013.01)

(58) Field of Classification Search
CPC .......... H03M 1/66; H03M 1/76; H03M 1/662; G09G 3/20; G09G 2300/0828; G09G 2310/027; G09G 2310/0291
USPC ................................. 341/144–150
See application file for complete search history.

(56) References Cited

U.S. PATENT DOCUMENTS

| 8,379,000 B2 | 2/2013 | Tsuchi | |
| 10,867,541 B2* | 12/2020 | Tsuchi | ............ G09G 3/20 |
| 2005/0088329 A1 | 4/2005 | Tsuchi | |
| 2006/0132344 A1 | 6/2006 | Ishii et al. | |

(Continued)

FOREIGN PATENT DOCUMENTS

| JP | 2000183747 A | 6/2000 |
| JP | 2002043944 A | 2/2002 |
| JP | 2009284310 A | 12/2009 |

*Primary Examiner* — Lam T Mai
(74) *Attorney, Agent, or Firm* — Rabin & Berdo, P.C.

(57) ABSTRACT

The present invention includes: a first decoder that outputs mutually different two voltages as first and second selection voltages based on a first bit group of a digital data signal in a first selection state, and outputs one or both of the two voltages as the first and the second selection voltages in a second selection state; a second decoder that outputs mutually different two voltages as third and fourth selection voltages based on a second bit group of the digital data signal in the first selection state and outputs one voltage based on the second bit group as the third and the fourth selection voltages in the second selection state; and an amplifier circuit that averages a combination of the first and the second selection voltages or the third and the fourth selection voltages with predetermined weighting ratios and outputs the averaged voltage.

4 Claims, 17 Drawing Sheets

(56) References Cited

U.S. PATENT DOCUMENTS

| | | |
|---|---|---|
| 2006/0214900 A1 | 9/2006 | Tsuchi et al. |
| 2006/0250289 A1 | 11/2006 | Tsuchi |
| 2007/0126689 A1 | 6/2007 | Ishii et al. |
| 2009/0085788 A1 | 4/2009 | Yamazaki et al. |
| 2009/0109077 A1 | 4/2009 | Tsuchi et al. |
| 2010/0283773 A1 | 11/2010 | Kim |
| 2011/0234571 A1 | 9/2011 | Tsuchi |
| 2012/0026154 A1 | 2/2012 | Tsuchi |
| 2020/0020278 A1 | 1/2020 | Lee |
| 2020/0027384 A1 | 1/2020 | Morita |

\* cited by examiner

| N: NUMBER OF OUTPUT PORTS OF DECODER CIRCUIT | X: NUMBER OF INPUT TERMINALS OF AMPLIFIER CIRCUIT | WEIGHTING RATIO |
|---|---|---|
| 2 : (T1, T2) | 2 : (P1, P2) | (1:1) |
| 3 : (T1, T2, T3) | 4 : (P1, P2, P3=P4) | (1:1:2) |

|  | FIRST SELECTION STATE (CTL=0) | | | SECOND SELECTION STATE (CTL=1) | | |
| --- | --- | --- | --- | --- | --- | --- |
|  | FIRST SELECTION VOLTAGE | SECOND SELECTION VOLTAGE | | FIRST SELECTION VOLTAGE | SECOND SELECTION VOLTAGE | |
| FIRST DECODER 30 | VA | VB | OUTPUT VA TO m TERMINALS AMONG T1 TO TN, AND OUTPUT VB TO REMAINING (N − m) TERMINALS | VA OR VB | VA OR VB | OUTPUT VA OR VB TO T1 TO TN |
|  | THIRD SELECTION VOLTAGE | FOURTH SELECTION VOLTAGE | | THIRD SELECTION VOLTAGE | FOURTH SELECTION VOLTAGE | |
| SECOND DECODER 40 | VC | VD | OUTPUT VC TO m TERMINALS AMONG T1 TO TN, AND OUTPUT VD TO REMAINING (N − m) TERMINALS | VC OR VD | VC OR VD | OUTPUT ONLY ONE OF VC OR VD TO T1 TO TN |

FIG. 6

| level | Vref | V(T1) | V(T2) | D3 | D2 | D1 | D0 |
|---|---|---|---|---|---|---|---|
| 0 | Vr0a | Vr0a | Vr0a | 0 | 0 | 0 | 0 |
| 1 | Vr0b | Vr0b | Vr0b | 0 | 0 | 0 | 1 |
| 2 | Vr1a | Vr1a | Vr1a | 0 | 0 | 1 | 0 |
| 3 | Vr1b | Vr1b | Vr1b | 0 | 0 | 1 | 1 |
| 4 | Vr2a | Vr2a | Vr2a | 0 | 1 | 0 | 0 |
| 5 | Vr2b | Vr2b | Vr2b | 0 | 1 | 0 | 1 |
| 6 | Vr3a | Vr3a | Vr3a | 0 | 1 | 1 | 0 |
| 7 | Vr3b | Vr3b | Vr3b | 0 | 1 | 1 | 1 |
| 8 | Vr4 | Vr4 | Vr4 | 1 | 0 | 0 | 0 |
| 9 |  | Vr4 | Vr5 | 1 | 0 | 0 | 1 |
| 10 | Vr5 | Vr5 | Vr5 | 1 | 0 | 1 | 0 |
| 11 |  | Vr5 | Vr6 | 1 | 0 | 1 | 1 |
| 12 | Vr6 | Vr6 | Vr6 | 1 | 1 | 0 | 0 |
| 13 |  | Vr6 | Vr7 | 1 | 1 | 0 | 1 |
| 14 | Vr7 | Vr7 | Vr7 | 1 | 1 | 1 | 0 |
| 15 |  | Vr7 | Vr8 | 1 | 1 | 1 | 1 |
| 16 | Vr8 | Vr8 | Vr8 |  |  |  |  |

Rows 0–7: RANGE A
Rows 8–16: RANGE B

FIG. 10A

| level | Vref | V(T1) | V(T2) | V(T3) | D4 | D3 | D2 | D1 | D0 |
|---|---|---|---|---|---|---|---|---|---|
| 0 | Vr0a | Vr0a | Vr0a | Vr0a | 0 | 0 | 0 | 0 | 0 |
| 1 | Vr0b | Vr0b | Vr0b | Vr0b | 0 | 0 | 0 | 0 | 1 |
| 2 | Vr1a | Vr1a | Vr1a | Vr1a | 0 | 0 | 0 | 1 | 0 |
| 3 | Vr1b | Vr1b | Vr1b | Vr1b | 0 | 0 | 0 | 1 | 1 |
| 4 | Vr2a | Vr2a | Vr2a | Vr2a | 0 | 0 | 1 | 0 | 0 |
| 5 | Vr2b | Vr2b | Vr2b | Vr2b | 0 | 0 | 1 | 0 | 1 |
| 6 | Vr3a | Vr3a | Vr3a | Vr3a | 0 | 0 | 1 | 1 | 0 |
| 7 | Vr3b | Vr3b | Vr3b | Vr3b | 0 | 0 | 1 | 1 | 1 |
| 8 | Vr2 | Vr2 | Vr2 | Vr2 | 0 | 1 | 0 | 0 | 0 |
| 9 |  | Vr2 | Vr3 | Vr2 | 0 | 1 | 0 | 0 | 1 |
| 10 |  | Vr2 | Vr2 | Vr3 | 0 | 1 | 0 | 1 | 0 |
| 11 |  | Vr2 | Vr3 | Vr3 | 0 | 1 | 0 | 1 | 1 |
| 12 | Vr3 | Vr3 | Vr3 | Vr3 | 0 | 1 | 1 | 0 | 0 |
| 13 |  | Vr3 | Vr4 | Vr3 | 0 | 1 | 1 | 0 | 1 |
| 14 |  | Vr3 | Vr3 | Vr4 | 0 | 1 | 1 | 1 | 0 |
| 15 |  | Vr3 | Vr4 | Vr4 | 0 | 1 | 1 | 1 | 1 |
| 16 | Vr4 | Vr4 | Vr4 | Vr4 | 1 | 0 | 0 | 0 | 0 |
| 17 |  | Vr4 | Vr5 | Vr4 | 1 | 0 | 0 | 0 | 1 |
| 18 |  | Vr4 | Vr4 | Vr5 | 1 | 0 | 0 | 1 | 0 |
| 19 |  | Vr4 | Vr5 | Vr5 | 1 | 0 | 0 | 1 | 1 |
| 20 | Vr5 | Vr5 | Vr5 | Vr5 | 1 | 0 | 1 | 0 | 0 |
| 21 |  | Vr5 | Vr6 | Vr5 | 1 | 0 | 1 | 0 | 1 |
| 22 |  | Vr5 | Vr5 | Vr6 | 1 | 0 | 1 | 1 | 0 |
| 23 |  | Vr5 | Vr6 | Vr6 | 1 | 0 | 1 | 1 | 1 |

Rows 0–7: RANGE A
Rows 8–23+: RANGE B

FIG. 10B

| CTL=0 | FIRST SELECTION STATE | 0 | 1 |
|---|---|---|---|
| D0 | | VC | VC |
| V(T1) | | VC | VC |
| V(T2) | | VD | VD |

FIG. 11A

| CTL=1 | SECOND SELECTION STATE | 0 | 1 |
|---|---|---|---|
| D0 | | VC | VD |
| V(T1) | | VC | VD |
| V(T2) | | VC | VD |

FIG. 11B

| CTL=0 | FIRST SELECTION STATE | |
|---|---|---|
| D0 | 0 | 1 |
| V(T1) | VC | VC |
| V(T2) | VC | VC |
| V(T3) | VD | VD |

FIG. 13A

| CTL=1 | SECOND SELECTION STATE | |
|---|---|---|
| D0 | 0 | 1 |
| V(T1) | VC | VD |
| V(T2) | VC | VD |
| V(T3) | VC | VD |

FIG. 13B

DIGITAL-TO-ANALOG CONVERTER CIRCUIT AND DATA DRIVER

CROSS REFERENCE TO RELATED APPLICATIONS

This is a continuation of U.S. application Ser. No. 16/800,909 filed on Feb. 25, 2020, which claims priority from a Japanese Patent Application No. 2019-45062 filed on Mar. 12, 2019, the contents of which are incorporated herein by reference.

BACKGROUND

1. Technical Field

The present invention relates to a digital-to-analog converter circuit and a data driver for a display device.

2. Related Art

Currently, as an active matrix type display device, a liquid crystal display device or an organic EL display device has become a mainstream. The display device includes a display panel, a data driver, and a scanning driver. On the display panel, a plurality of data lines and a plurality of scanning lines are wired in an intersecting manner, and display cells connected to the plurality of data lines via pixel switches are arranged in a matrix. The data driver supplies analog voltage signals corresponding to gradation levels to the plurality of data lines of the display panel. The scanning driver supplies scanning signals that control ON/OFF of respective pixel switches to the plurality of scanning lines of the display panel. The data driver includes a digital-to-analog converter circuit that converts a video digital signal into analog voltages corresponding to luminance levels and supplies voltage signals obtained by amplifying the analog voltages to respective data lines of the display panel.

The following describes a schematic configuration of the data driver.

The data driver includes, for example, a shift register, a data register latch, a level shifter, and a DA (digital to analog) converter.

The shift register generates a plurality of latch timing signals for selecting a latch in synchronization with a clock signal corresponding to a start pulse supplied from a display controller and supplies the latch timing signals to the data register latch. The data register latch acquires video digital data supplied from the display controller for every predetermined number of pieces (for example, n pieces) based on the respective latch timing signals supplied from the shift register, and supplies n pieces of the video digital data signal indicating the respective pieces of the video digital data. The level shifter supplies the DA converter with n pieces of the video digital data signals after level shifting obtained by performing level shift processing to increase amplitudes of the signals for each of the n pieces of the video digital data signals supplied from the data register latch.

The DA converter includes a reference voltage generation circuit, a decoder unit, and an amplifier unit.

The reference voltage generation circuit generates a plurality of reference voltages having mutually different voltage values to supply the reference voltages to the decoder unit. For example, the reference voltage generation circuit supplies the decoder unit with a plurality of divided voltages as a reference voltage group obtained by dividing between a power supply voltage and the reference voltage with a ladder resistor. The digital-to-analog conversion using the plurality of reference voltages generated by the ladder resistor is referred to as an RDAC system.

The decoder unit includes n decoder circuits disposed corresponding to respective outputs of the data driver. The decoder circuits each receive the video digital data signal supplied from the level shifter, select the reference voltage corresponding to the video digital data signal among the plurality of reference voltages, and supply the amplifier unit with the selected reference voltage.

The amplifier unit includes n amplifier circuits that individually amplify the reference voltages selected by the respective decoders in the decoder unit and output the amplified reference voltages.

Now, in the DA converter described above, as the number of the reference voltages generated in the reference voltage generation circuit is increased, the number of gradations (the number of colors) of the luminance level to be expressed can be increased. However, increasing the number of the reference voltages generated in the reference voltage generation circuit increases a chip size (manufacturing cost) of the data driver by the amount of the increased number of reference voltages.

Therefore, there has been proposed a digital-to-analog converter circuit that employs an operational amplifier as the amplifier circuit described above (for example, see JP-A-2000-183747, JP-A-2002-43944, and JP-A-2009-284310). The operational amplifier generates a voltage between mutually adjacent input voltages by weighting and averaging (also referred to as a weighted average) a plurality of input voltages, that is, the operational amplifier performs what is called an interpolation.

With the amplifier circuit (also referred to as an interpolation amplifier) that performs the interpolation, the voltage values by the number of gradations greater than the number of voltage values that can be expressed by the plurality of input voltages can be obtained by the interpolation based on the plurality of input voltages. Accordingly, even if the total number of the reference voltages generated in the reference voltage generation circuit is reduced, the voltages by the desired number of gradations can be generated.

The following describes the amplifier circuit included in the digital-to-analog converter circuit described above with reference to FIG. 1A and FIG. 1B.

FIG. 1A is a circuit diagram illustrating an exemplary configuration of the amplifier circuit. The amplifier circuit illustrated in FIG. 1A receives x (x is an integer of 2 or more) input voltages V1 to Vx, performs the interpolation to the input voltages V1 to Vx, and generates a weighted average voltage of the input voltages V1 to Vx to output the weighted average voltage.

The amplifier circuit includes x non-inverting input terminals P1 to Px that receive the input voltages V1 to Vx, a single inverting input terminal, an output port Sk, x differential stage circuits 29_1 to 29_$x$ of the same conductivity type, a current mirror circuit 28, and an amplifier stage circuit 26.

The differential stage circuit 29_$x$ includes a differential pair including N-channel type transistors 21_$x$ and 22_$x$, and a current source 23_$x$ that drives the differential pair. The current source 23_$x$ is disposed between the differential pair and a power supply terminal VSS. The other differential stage circuits 29_1 to 29_(x−1) each have the configuration same as that of the differential stage circuit 29_$x$. The respective one transistors 21_1 to 21_$x$ of the respective differential pairs include gates constituting the non-inverting input terminals P1 to Px of the amplifier circuit, respectively.

The respective other transistors 22_1 to 22_x of the respective differential pairs include gates that are connected in common and constitute the inverting input terminal of the amplifier circuit.

The inverting input terminal of the amplifier circuit is connected to the output port Sk and constitutes a voltage follower feedback amplifier circuit. The respective differential pairs of the differential stage circuits 29_1 to 29_x have respective one output ports commonly connected to a node n21, and the respective differential pairs of the differential stage circuits 29_1 to 29_x have the respective other output ports commonly connected to a node n22.

The current mirror circuit 28 includes P-channel type transistors 24 and 25 is disposed between a power supply terminal VDD and the nodes n21 and n22. The amplifier stage circuit 26 receives a voltage generated at least at the node n21 to cause an amplification operation, thus amplifying to output an output voltage Vout from the output port Sk. The voltage value of the output voltage Vout at this time is defined as a voltage Vexp.

The following describes a relationship between signal voltages V1 to Vx, which are input to the non-inverting input terminals P1 to Px of the amplifier circuit, and the voltage Vexp.

The signal voltages V1 to Vx have voltages of levels selected by the above-described decoder circuits in every predetermined data period. The signal voltages V1 to Vx are each a step signal voltage that has the voltage value changed in a stepped manner from the voltage in the previous data period. The signal voltages V1 to Vx constitute a voltage group that includes x voltages including the same voltages within a voltage range sufficiently small compared with an output dynamic range of the amplifier circuit.

The voltage Vexp is equivalent to the weighted average of the signal voltages V1 to Vx to be input when an amplification factor of the amplifier circuit is 1.

The following describes an operation of the amplifier circuit with an exemplary case where the transistors constituting the differential pair of a j-th (j is an integer of 1 to x) circuit among the differential stage circuits 29_1 to 29_x are Aj times of a reference size ratio (W/L ratio) corresponding to a ratio of a channel width W to a channel length L, that is, a weighting ratio is Aj.

Drain currents Ia-j, Ib-j of the j-th differential pair (21_j, 22_j) are expressed by a formula (5) and a formula (6) below.

$$Ia\_j = (Aj \cdot \beta/2) \cdot (vj - VTH)^2 \quad (5)$$

$$Ib\_j = (Aj \cdot \beta/2) \cdot (Vexp - VTH)^2 \quad (6)$$

β: gain factor when the transistor has the reference size ratio of 1

VTH: threshold voltage of the transistor

The commonly connected output ports of the differential stage circuits 29_1 to 29_x are connected to the input (node n22) and the output (node n21) of the current mirror circuit 28, and controlled such that the commonly connected output ports of the differential stage circuits 29_1 to 29_x have equal output currents. Accordingly, the following formula (7) is satisfied for the output currents of the differential stage circuits 29_1 to 29_x.

$$Ia\_1 + Ia\_2 + \ldots + Ia\_x = Ib\_1 + Ib\_2 + \ldots + Ib\_x \quad (7)$$

In the formula (5) and the formula (6), j is developed in a range of 1 to x and assigned to the formula (7). Here, assuming that both sides are equal for first-order terms of the threshold voltage VTH, the following formula (8) and formula (9) are derived.

$$A1 \cdot V1 + A2 \cdot V2 + \ldots + Ax \cdot Vx = (A1 + A2 + \ldots + Ax) \times Vexp \quad (8)$$

$$Vexp = (A1 \cdot V1 + \ldots + Ax \cdot Vx)/(A1 + \ldots + Ax) \quad (9)$$

Therefore, the amplifier circuit outputs a value obtained by dividing a sum (A1·V1+ . . . +Ax·Vx) of products of the signal voltages input to the respective differential pairs and the weighting ratios by a sum (A1+ . . . +Ax) of the weighting ratios as indicated by the formula (9), that is, the voltage Vexp corresponding to the weighted average of the signal voltages V1 to Vx, as the output voltage Vout. While FIG. 1A illustrates the configuration that includes the differential stage circuit including the differential pair of the N-channel type transistors and the current mirror circuit of the P-channel type transistors, a configuration that includes a differential stage circuit including a differential pair of P-channel type transistors and a current mirror circuit of N-channel type transistors, or a configuration that includes a differential stage circuit including differential pairs of transistors of both conductivity types of the N-channel type and the P-channel type and a current mirror circuit may be employed. In both cases, the formula (9) is satisfied.

Next, a description will be given of a case where the amplifier circuit of FIG. 1A is applied to an output amplifier circuit of the decoder circuit included in the data driver described above.

FIG. 1B illustrates a correspondence among N output ports T1 to TN of the respective decoder circuits, the non-inverting input terminals P1 to Px of the amplifier circuit, and the weighting ratios when the differential stage circuits 29_1 to 29_x have the same configuration, that is, the weighting ratios of the respective differential stage circuits are configured to be same.

For example, assume a case where combinations of two voltages including an overlap of the two voltages VA and VB having mutually different voltage values are output from the N (N is an integer of 2 or more) output ports T1 to TN of the decoder circuit, and supply them to the x (note that, x is 2 to the power of (N−1)) non-inverting input terminals of the amplifier circuit with predetermined ratios. At this time, the amplifier circuit of FIG. 1A can output a plurality of voltages obtained by dividing between the two voltages VA and VB into 2 to the power of (N−1), which is "x", based on both voltages.

Specifically, for example, when both "N" and "x" are 2, that is, the output ports T1 and T2 of the decoder circuit are corresponded to the non-inverting input terminals P1 and P2 of the amplifier circuit, the weighting ratio to the terminals T1 and T2 is 1:1. Accordingly, by selectively inputting the combination of the mutually different two voltages VA and VB as a voltage V(T1) and a voltage V(T2) to the non-inverting input terminals P1 and P2 of the amplifier circuit, the voltages VA, VB, ([VA+VB]/2) can be output from the amplifier circuit corresponding to the combination of the voltages VA and VB, which is (VA, VA), (VB, VB), or (VA, VB).

For example, "N" is 3 and "x" is 4, that is, the output ports T1 to T3 of the decoder circuit are corresponded to the non-inverting input terminals P1 to P4 of the amplifier circuit, and at this time, the non-inverting input terminals P3 and P4 are commonized and the weighting ratio to the terminals (T1, T2, and T3) is set to (1:1:2). By selectively inputting the combination of the different two voltages VA and VB as voltages V(T1), V(T2), and V(T3) to the non-inverting input terminals of the amplifier circuit, the voltages obtained by dividing the voltages VA and VB into four voltages can be output from the amplifier circuit corresponding to the combination of the voltages VA and VB. Similarly, further extension can be easily made.

While the case where the differential stage circuits 29_1 to 29_x of FIG. 1A have the same configuration is described above, it may be configured to have the predetermined weighting for each differential stage circuit.

Accordingly, the digital-to-analog converter circuit that includes the amplifier circuit illustrated in FIG. 1A can significantly reduce the number of reference voltages generated in the reference voltage generation circuit and the number of the switch transistors for selecting the reference voltage in the decoder circuit. Especially, when the number of bits of the video digital signal is large, this is an effective means to suppress increase in circuit size of the digital-to-analog converter to reduce increase in chip area.

Recently, with increased screen size and higher resolution of display panel, load capacitance of data lines of the display panel required to be driven by a data driver increases, and a driving period (also referred to as one data period) per one pixel (display cell) for driving the data line by the data driver tends to be shortened.

The increased load capacitance and the shortened driving period of the data line require high speed driving of the data driver for ensuring a charging percentage with a predetermined value or more over the whole region of the data lines. The charging percentage of the data lines lower than the predetermined value causes an image degradation, such as an uneven luminance.

For example, a 4K display panel (the number of data lines: 3840×3, the number of scanning lines: 2160) having a frame frequency of 120 Hz has one data period of about 3.7 us, and a 8K display panel having a resolution four times of that of the 4K display panel has one data period of about 1.85 us. Increasing an operating current with increase of a slew rate of the output voltage can ensure speed up of the amplifier circuit to some extent. However, because of the shortened one data period in association with the higher definition display panel, the change speed of the input voltage of the amplifier circuit has become non-ignorable. The change speed of the input voltage of the amplifier circuit influences a change speed of the output voltage of the amplifier circuit, and the decreased charging percentage of the data line (finally, a charging percentage of an electrode inside the display cell) causes the degradation of the quality of the panel display.

As described above, the amplifier circuit configured to perform the interpolation has a plurality of input terminals, and parasitic capacitances of the plurality of input terminals influence the change speed of the input voltage of the amplifier circuit in some cases. The following describes this respect.

For convenience of explanation, assume that the number N of the output ports of each of the decoder circuits included in the decoder unit is "2," and the number x of the non-inverting input terminals of the amplifier circuit is "2." The worst condition that causes the decrease of the change speed of the voltage is a case where the same reference voltage is input to the two non-inverting input terminals of the amplifier circuit. That is, one reference voltage selected in the decoder circuit is supplied to each of the two non-inverting input terminals of the amplifier circuit via the two output ports.

For example, when the input voltage of the amplifier circuit is a reference voltage VrM in a previous data period and changes to a reference voltage Vr0a higher than the reference voltage VrM in the next data period, the change speed depends on the following condition. That is, the condition includes a wiring resistance in transmitting the reference voltage Vr0a and an ON-resistance of a selection switch in the decoder circuit and gate parasitic capacitances (for example, Cp1 and Cp2 of FIG. 1A) of the two non-inverting input terminals of the amplifier circuit that receive the reference voltage Vr0a.

In the worst case where a plurality of amplifier circuits corresponding to all the outputs of the data driver, that is, all the non-inverting input terminals of the output amplifier circuits receive the reference voltage Vr0a, the change speed of the input voltage of the amplifier circuit from VrM to Vr0a is decreased in accordance with a time constant of an impedance. Accordingly, a problem arises in that the change of the output voltage of the amplifier circuit is also slowed. As the number x of the non-inverting input terminals of each amplifier circuit increases, the delay of the change of the output voltage of the amplifier circuit increases.

The reference voltages generated by the reference voltage generation circuit in the data driver each have the voltage value set corresponding to a gamma characteristic curve of the display device.

FIG. 2 is a drawing illustrating an exemplary gamma characteristic curve of the display device.

FIG. 2 illustrates a relationship between a gradation level of the display device corresponding to a digital signal in one-to-one and a voltage (referred to as a driving voltage) applied to the display device by the data driver.

As illustrated in FIG. 2, in a range A (corresponding to a voltage range Vdw) from the gradation level "0" to the gradation level "Lk," the change of the driving voltage relative to the change of the gradation level has a nonlinear characteristic, and a voltage difference between the driving voltages corresponding to the respective gradation levels next to one another is large. Meanwhile, in a range B (corresponding to a voltage range Vup) from the gradation level "Lk" to the gradation level "Lmax," the change of the driving voltage relative to the change of the gradation level can have a linear approximation in a predetermined range of the gradation level, and the voltage difference between the driving voltages corresponding to the respective gradation levels next to one another is relatively small. Therefore, the interpolation can be applied to the range B, while the interpolation is not appropriate for the range A because the interpolation in the range A increases error.

Accordingly, in outputting the driving voltage corresponding to the gradation level belonging to the range A (voltage range Vdw) where the change amount of the voltage value of the driving voltage relative to the change of the gradation level is large, the same voltage is supplied to the plurality of non-inverting input terminals of the amplifier circuit. In the range B (voltage range Vup) to which the interpolation is applied, in outputting the voltage same as the reference voltage selected by the decoder circuit as the driving voltage, the same reference voltage is supplied to the plurality of non-inverting input terminals of the amplifier circuit.

Accordingly, in the worst case where the plurality of non-inverting input terminals of each of all the amplifier circuits corresponding to all the outputs of the data driver are commonly connected to a wiring (referred to as a reference voltage line) that transmits a single reference voltage, the change of the input voltage to the amplifier circuit is slowed. Therefore, in accordance with this, a problem arises in that the change of the output voltage of the amplifier circuit is also slowed. Meanwhile, the range B includes a case where the same reference voltage is supplied to the plurality of the non-inverting input terminals of the amplifier circuit and a case where the different reference voltages are supplied to the plurality of the non-inverting input terminals of the amplifier circuit. Therefore, in the range B, a problem arises in that the change speed of the output voltage of the amplifier circuit differs for each gradation level. These problems cause the degradation of the display quality, such as a decrease in luminance and an uneven display. Note that, while the gamma characteristic curve differs depending on the display device, the gamma characteristic curve mostly includes a combination of the range A and the range B.

Therefore, the present invention provides a digital-to-analog converter circuit configured to ensure the increased speed of processing of the digital-to-analog converter circuit that includes an amplifier circuit to perform interpolations and configured to equalize change speed of output voltages of the amplifier circuits, and a data driver for a display device using the digital-to-analog converter circuit.

SUMMARY

A digital-to-analog converter circuit according to the present invention includes a reference voltage generation circuit, a first decoder, a second decoder, and an amplifier circuit. The reference voltage generation circuit generates a plurality of reference voltages having mutually different voltage values. The reference voltage generation circuit outputs the plurality of reference voltages as a first reference voltage group corresponding to a first range and a second reference voltage group corresponding to a second range of the plurality of reference voltages. The first decoder receives a first bit group in a digital data signal of t (t is an integer of 2 or more) bits, selects two reference voltages including an overlap from the first reference voltage group based on the first bit group, and outputs the respective two reference voltages as first and second selection voltages. The digital data signal includes the first bit group and a second bit group. The second decoder receives the second bit group in the digital data signal, selects two reference voltages including an overlap from the second reference voltage group based on the second bit group, and outputs the respective two reference voltages as third and fourth selection voltages. The amplifier circuit outputs a voltage as an output voltage. The voltage is obtained by averaging a plurality of voltages with predetermined weighting ratios and amplifying the averaged voltage. The plurality of voltages are each the first selection voltage or the second selection voltage, or the plurality of voltages are each the third selection voltage or the fourth selection voltage. The first and the second decoders receive a control signal that instructs to set to any one of a first selection state and a second selection state. The first decoder selects mutually different two reference voltages from the first reference voltage group based on the first bit group and outputs the respective two reference voltages as the first and the second selection voltages when the first decoder is set to the first selection state, and the first decoder selects two reference voltages including an overlap from the first reference voltage group based on the first bit group and outputs the respective two reference voltages as the first and the second selection voltages when the first decoder is set to the second selection state. The second decoder selects mutually different two reference voltages from the second reference voltage group based on the second bit group and outputs the respective two reference voltages as the third and the fourth selection voltages when the second decoder is set to the first selection state, and the second decoder selects one reference voltage from the second reference voltage group based on the second bit group and outputs the one voltage as the third and the fourth selection voltages when the second decoder is set to the second selection state.

A digital-to-analog converter circuit according to the present invention includes a reference voltage generation circuit, a first decoder, a second decoder, and an amplifier circuit. The reference voltage generation circuit generates a first reference voltage group and a second reference voltage group. The first reference voltage group includes a plurality of first reference voltages having mutually different voltage values. The second reference voltage group includes a plurality of second reference voltages having mutually different voltage values. The first decoder is connected to the reference voltage generation circuit. The first decoder outputs first and second selection voltages from the first reference voltage group based on a first selection signal. The second decoder is connected to the reference voltage generation circuit. The second decoder outputs third and fourth selection voltages from the second reference voltage group based on a second selection signal. The amplifier circuit is connected to the first decoder and the second decoder. The amplifier circuit outputs a plurality of output voltages by averaging a plurality of first voltages or a plurality of second voltages with predetermined weighting ratios and amplifies the averaged voltage. The plurality of first voltages includes at least one of the first selection voltage and the second selection voltage, and the plurality of second voltages includes at least one of the third selection voltage and the fourth selection voltage.

A data driver according to the present invention includes a digital-to-analog converter unit that receives a video data signal and converts the video data signal into a driving voltage to supply the driving voltage to a display device. The video data signal indicates a luminance level by t (t is an integer of 2 or more) bits including a first bit group and a second bit group. The driving voltage has a voltage value with a magnitude corresponding to the luminance level. The digital-to-analog converter unit includes a reference voltage generation circuit, a first decoder, a second decoder, and an amplifier circuit. The reference voltage generation circuit generates a plurality of reference voltages having mutually different voltage values. The reference voltage generation circuit outputs the plurality of reference voltages as a first reference voltage group corresponding to a first range and a second reference voltage group corresponding to a second range of the plurality of reference voltages. The first decoder selects two reference voltages including an overlap from the first reference voltage group based on the first bit group in the video data signal, and outputs the respective two reference voltages as first and second selection voltages. The second decoder selects two reference voltages including an overlap from the second reference voltage group based on the second bit group in the video data signal, and outputs the respective two reference voltages as third and fourth selection voltages. The amplifier circuit outputs a voltage as the driving voltage. The voltage is obtained by averaging a plurality of voltages with predetermined weighting ratios and amplifying the averaged voltage. The plurality of voltages are each the first selection voltage or the second selection voltage, or the plurality of voltages are each the third selection voltage or the fourth selection voltage. The first and the second decoders receive a control signal that instructs to set to any one of a first selection state and a second selection state. The first decoder selects mutually different two reference voltages from the first reference voltage group based on the first bit group and outputs the respective two reference voltages as the first and the second selection voltages when the first decoder is set to the first selection state, and the first decoder selects two reference voltages including an overlap from the first reference voltage group based on the first bit group and outputs the respective two reference voltages as the first and the second selection voltages when the first decoder is set to the second selection state. The second decoder selects mutually different two reference voltages from the second reference voltage group based on the second bit group and outputs the respective two reference voltages as the third and the fourth selection voltages when the second decoder is set to the first selection state, and the second decoder selects one reference voltage from the second reference voltage group based on the second bit group and outputs the one voltage as the third and the fourth selection voltages when the second decoder is set to the second selection state.

The present invention employs the following first and second decoders as decoders of a digital-to-analog converter circuit that includes an amplifier circuit configured to receive a plurality of voltages and perform interpolation based on the plurality of voltages. The first and second decoders are set to one of a first selection state and a second selection state corresponding to a control signal, and the selection state is switchable.

The first decoder selects mutually different two reference voltages from a plurality of reference voltages based on a first bit group of a digital data signal, and supplies the respective reference voltages to the amplifier circuit as first and second selection voltages when the first decoder is set to the first selection state. Meanwhile, the first decoder selects two reference voltages including an overlap from the plurality of reference voltages based on the first bit group, and supplies the respective reference voltages to the amplifier circuit as the first and the second selection voltages when the first decoder is set to the second selection state.

The second decoder selects mutually different two reference voltages from the plurality of reference voltages based on a second bit group of the digital data signal, and supplies the respective reference voltages to the amplifier circuit as third and fourth selection voltages when the second decoder is set to the first selection state. Meanwhile, the second decoder selects one reference voltage from the plurality of reference voltages based on the second bit group, and supplies the one reference voltage to the amplifier circuit as the third and the fourth selection voltages when the second decoder is set to the second selection state.

Therefore, in the first selection state, one selection voltage among the two selection voltages having mutually different voltage values is supplied to m terminals (m is an integer of 1 or more) among a plurality of input terminals of the amplifier circuit, and the other selection voltage is supplied to the other input terminals of the amplifier circuit regardless of contents of the digital data signal.

Accordingly, a delay period caused depending on a parasitic capacitance at an input unit of the amplifier circuit can be shortened compared with a case of a conventional digital-to-analog converter circuit where one selection voltage is supplied to every input terminal of the amplifier circuit regardless of the contents of the digital data signal. Thus, the delay of the change speed of the output voltage of the amplifier circuit is improved in the worst case, and uniforming the change speed of the output voltage of the amplifier circuit for each gradation level can be ensured. This improves the display quality.

BRIEF DESCRIPTION OF DRAWINGS

FIG. 6 is a drawing illustrating operations of a first decoder 30 and a second decoder 40 separately for a first selection state and a second selection state;

FIG. 10A is a drawing illustrating a specification appropriate for a case where the number N of input terminals of the amplifier circuit 20 is N=2;

FIG. 10B is a drawing illustrating a specification appropriate for a case where the number N of input terminals of the amplifier circuit 20 is N=3;

FIG. 11A is a drawing illustrating an exemplary operation configuration of the second decoder 40 illustrated in FIG. 9 in the first selection state;

FIG. 11B is a drawing illustrating an exemplary operation configuration of the second decoder 40 illustrated in FIG. 9 in the second selection state;

FIG. 13A is a diagram illustrating another exemplary operation configuration of the second decoder 40 illustrated in FIG. 9 in the first selection state;

FIG. 13B is a diagram illustrating another exemplary operation configuration of the second decoder 40 illustrated in FIG. 9 in the second selection state;

DETAILED DESCRIPTION

Figure 3:
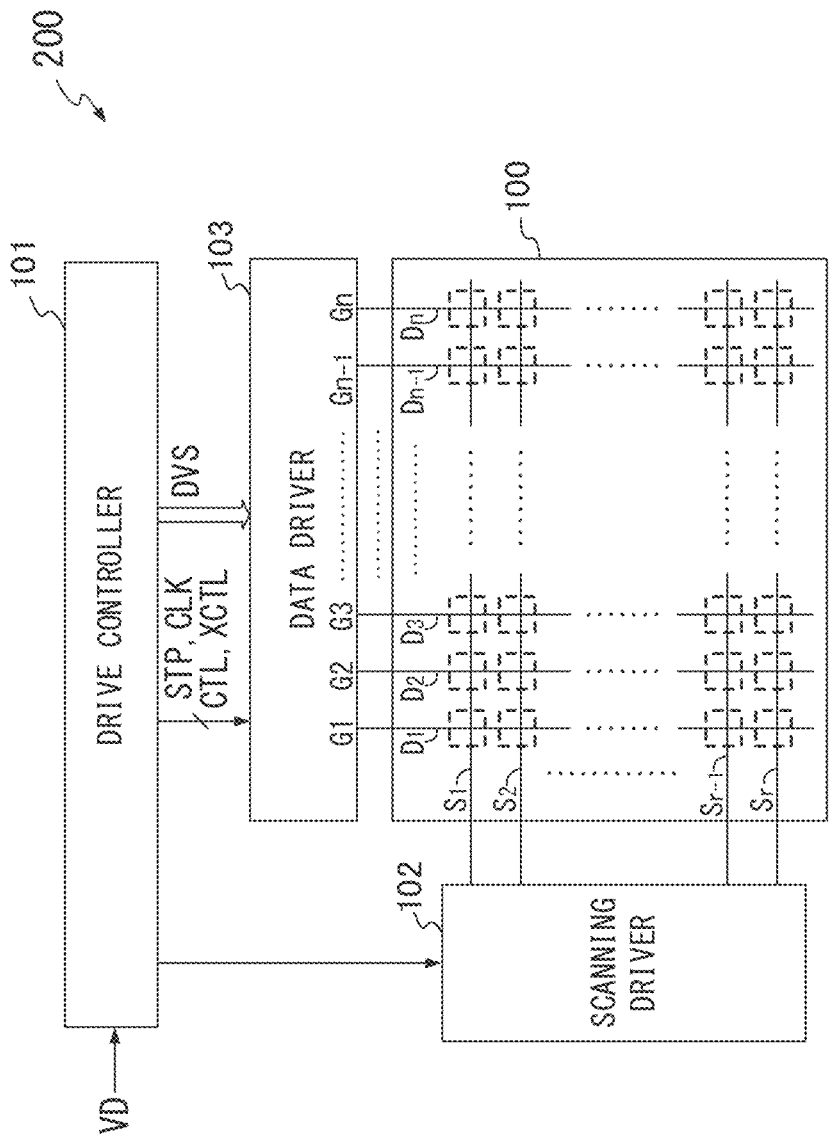
FIG. 3 is a block diagram illustrating a schematic configuration of a display device 200 that includes a digital-to-analog converter circuit and a data driver according to the present invention.

FIG. 3 is a block diagram illustrating a schematic configuration of a display device 200 that includes a digital-to-analog converter circuit and a data driver according to the present invention.

As illustrated in FIG. 3, the display device 200 includes a display panel 100, a drive controller 101, a scanning driver 102, and a data driver 103.

The display panel 100 includes, for example, a liquid crystal panel or an organic EL panel, and includes r (r is a natural number of 2 or more) horizontal scanning lines S1 to Sr extending in a horizontal direction of a two-dimensional screen, and n (n is a natural number of 2 or more) data lines D1 to Dn extending in a vertical direction of the two-dimensional screen. Display cells serving as pixels are formed on respective intersecting portions of the horizontal scanning lines and the data lines.

The drive controller 101 supplies the scanning driver 102 with a scan timing signal to generate a horizontal scanning pulse supplied to each of the scanning lines.

The drive controller 101 generates various control signals including a start pulse signal STP, a clock signal CLK, and control signals CTL and XCTL, and a video digital signal DVS based on a video signal VD to supply them to the data driver 103.

The scanning driver 102 applies the horizontal scanning pulse in order to each of the horizontal scanning lines S1 to Sr of the display panel 100 based on the scan timing signal supplied from the drive controller 101.

The data driver 103 acquires a series of video data PD, which is included in the video digital signal DVS and individually indicates a luminance level of each pixel in, for example, 8 bits, corresponding to the various control signals (STP, CLK, CTL, and XCTL) supplied from the drive controller 101. The number of bits of the video data PD is not limited to 8 bits. Then, the data driver 103 converts the acquired series of video data PD into n driving voltages G1 to Gn having voltage values with magnitudes corresponding to the luminance levels indicated by the respective pieces of the video data PD for every (n) horizontal scanning line, and supply them to the respective data lines D1 to Dn of the display panel 100.

Figure 4:
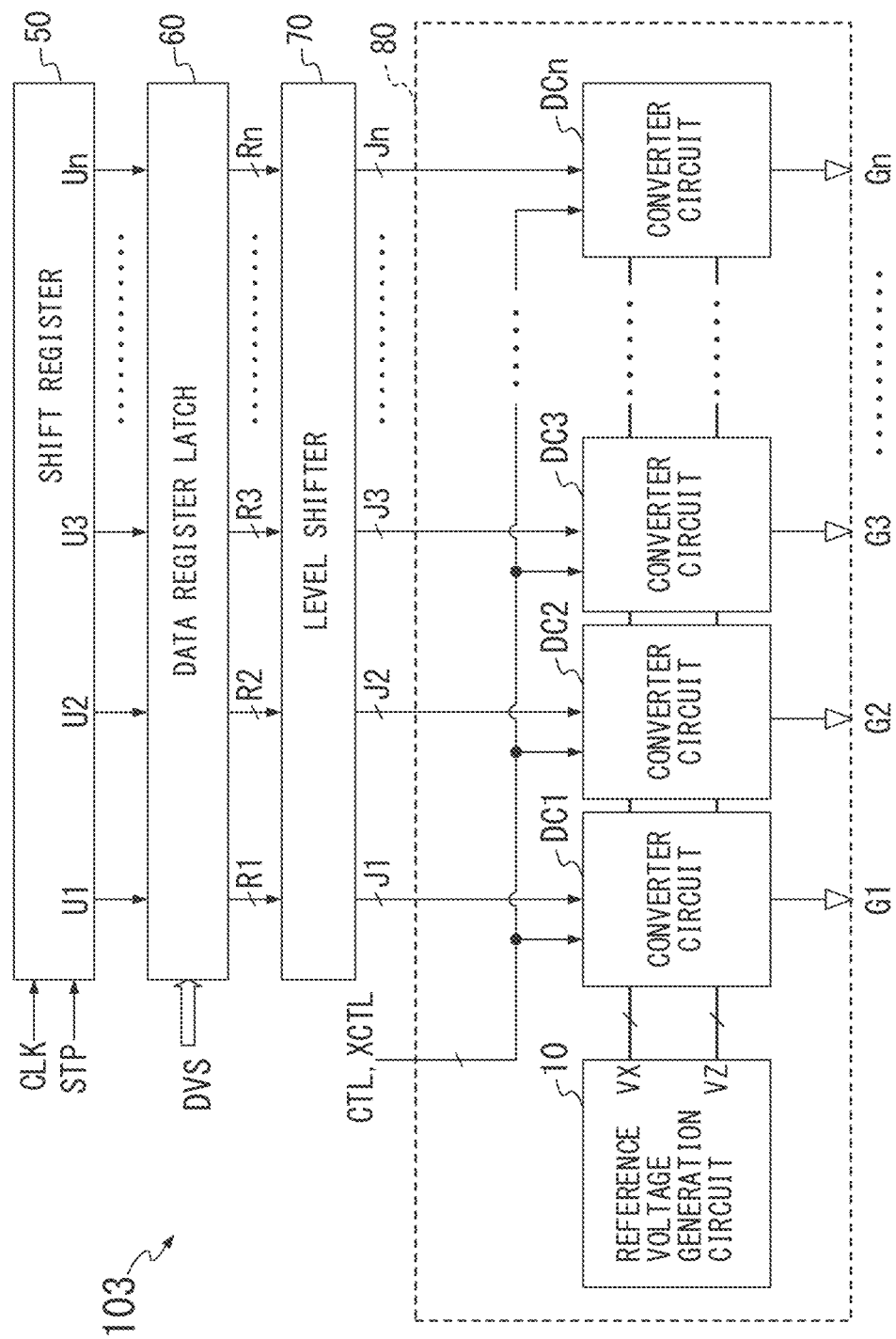
FIG. 4 is a block diagram illustrating an internal configuration of a data driver 103.

FIG. 4 is a block diagram illustrating an internal configuration of the data driver 103.

As illustrated in FIG. 4, the data driver 103 includes a shift register 50, a data register latch 60, a level shifter 70, and a digital to analog (DA) converter 80.

The shift register 50 generates latch timing signals U1 to Un for selecting a latch in synchronization with the clock signal CLK corresponding to the start pulse STP supplied from the drive controller 101, and supplies them to the data register latch 60.

The data register latch 60 sequentially acquires the video data PD supplied from the drive controller 101 based on the latch timing signals U1 to Un, and supplies video data signals R1 to Rn indicating the respective pieces of the video data PD to the level shifter 70 for every (n) horizontal scanning lines.

The level shifter 70 performs level shift processing to increase the signal level to each of the video data signals R1 to Rn, and supplies obtained n pieces of video data signal J1 to Jn to the DA converter 80.

The DA converter 80 receives each of the video data signals J1 to Jn as the digital data signals based on the control signals CTL and CTLX, converts the video data signals J1 to Jn to driving voltages G1 to Gn having analog voltage values, respectively, and outputs them.

As illustrated in FIG. 4, the DA converter 80 includes a reference voltage generation circuit 10 and converter circuits DC1 to DCn.

The reference voltage generation circuit 10 generates a plurality of reference voltages having mutually different voltage values, and outputs a first reference voltage group VX corresponding to a first range (for example, a range B of FIG. 2) and a second reference voltage group VZ corresponding to a second range (for example, a range A of FIG. 2) among the plurality of reference voltages. The reference voltage generation circuit 10 supplies the output first reference voltage group VX and the second reference voltage group VZ to each of the converter circuits DC1 to DCn.

The converter circuits DC1 to DCn receive the first reference voltage group VX, the second reference voltage group VZ, and the control signals CTL and CTLX, and individually receive the video data signals J1 to Jn, respectively. The converter circuits DC1 to DCn select the reference voltages corresponding to the video data signals J1 to Jn for each video data signal based on the control signals CTL and CTLX from the first reference voltage group VX and the second reference voltage group VZ. The converter circuits DC1 to DCn output the reference voltages that they have selected as driving voltages G1 to Gn, respectively. Note that, as illustrated in FIG. 4, the converter circuits DC1 to DCn are disposed corresponding to the video data signals J1 to Jn, respectively, and have the same internal configuration.

Example 1

Figure 5:
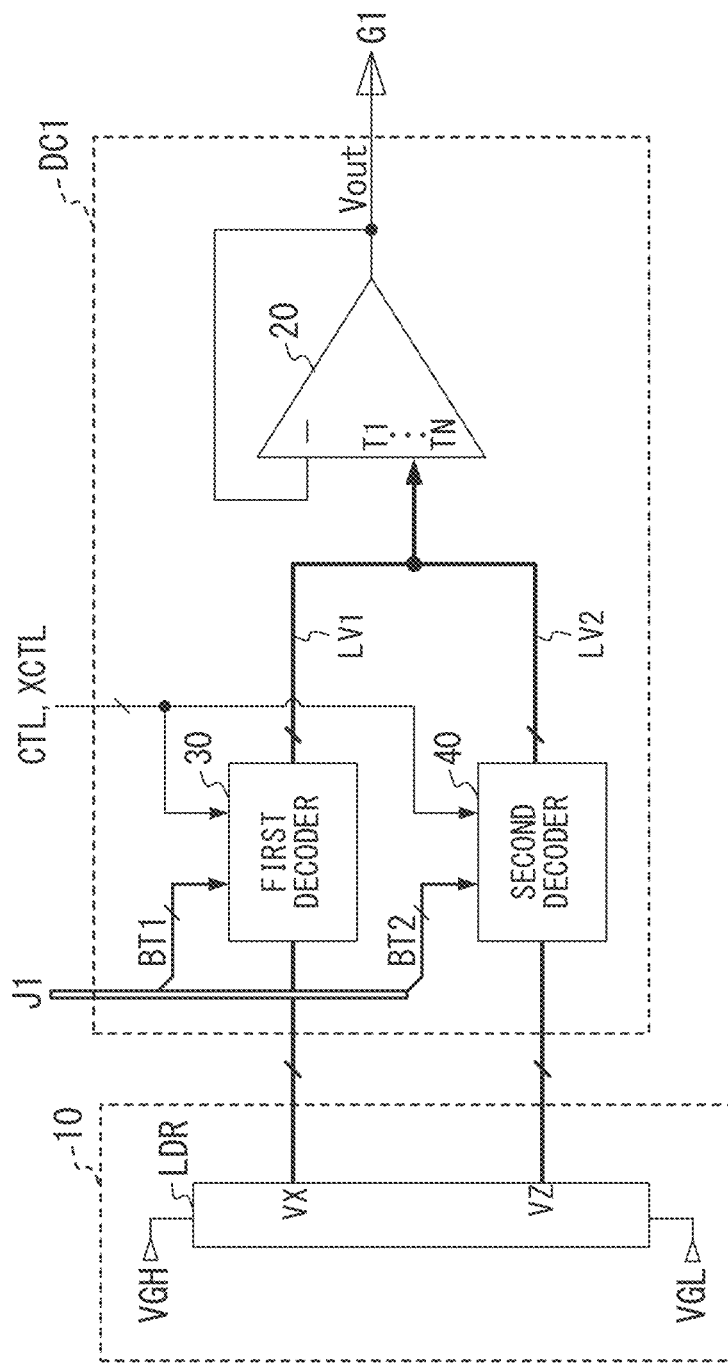
FIG. 5 is a block diagram illustrating an exemplary configuration of the DA converter circuit according to the present invention.

FIG. 5 is a block diagram illustrating a configuration of a digital-to-analog converter circuit (also referred to as a DA converter circuit) of a RDAC system according to the present invention that includes the converter circuit DC1 and the reference voltage generation circuit 10 extracting the converter circuit DC1 among the converter circuits DC1 to DCn illustrated in FIG. 4.

The reference voltage generation circuit 10 includes a ladder resistor LDR that receives, for example, a predetermined electric potential VGH and an electric potential VGL lower than the electric potential VGH, and divides a voltage between the electric potentials VGH and VGL into a plurality of voltages having mutually different voltage values. The reference voltage generation circuit 10 classifies the plurality of divided voltages divided by the ladder resistor LDR as follows, thus generating the first reference voltage group VX and the second reference voltage group VZ.

Figure 2:
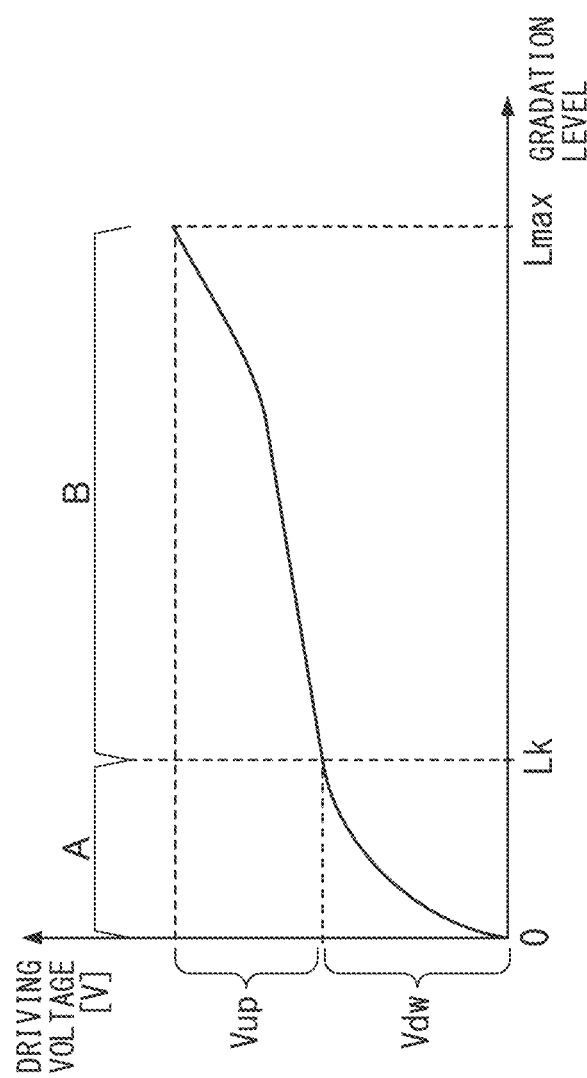
FIG. 2 is a drawing illustrating an exemplary gamma characteristic curve of a display device.

A plurality of reference voltages belonging to the first reference voltage group VX are included in a voltage range Vup of the driving voltage corresponding to the gradation levels of the range B where the change of the driving voltage relative to the change of the gradation level has a linear characteristic for each predetermined gradation level range as illustrated in FIG. 2. The plurality of reference voltages belonging to the first reference voltage group VX have relatively small differences between the voltage values corresponding to the respective adjacent gradation levels, and included in the voltage range applicable to the interpolation performed in the amplifier circuit 20 described later.

A plurality of reference voltages belonging to the second reference voltage group VZ are included in a voltage range Vdw of the driving voltage corresponding to the gradation levels of the range A where the change of the driving voltage relative to the change of the gradation level has a nonlinear characteristic as illustrated in FIG. 2. The plurality of reference voltages belonging to the second reference voltage group VZ includes the reference voltages that have relatively large differences between the voltage values corresponding to the respective adjacent gradation levels. Therefore, the plurality of reference voltages belonging to the second reference voltage group VZ are included in the voltage range inappropriate for the interpolation performed in the amplifier circuit 20.

The converter circuit DC1 includes the amplifier circuit 20, a first decoder 30, and a second decoder 40.

Both the first decoder 30 and the second decoder 40 receive the control signals (CTL, XCTL) that instruct a setting to one of the first selection state and the second selection state. Accordingly, the first decoder 30 and the second decoder 40 are each set to the first selection state when the control signals (CTL, XCTL) instruct the first selection state, and set to the second selection state when the control signals (CTL, XCTL) instruct the second selection state. Furthermore, the first decoder 30 and the second decoder 40 receive, for example, the video data signal J1 as the digital data signal of, for example, 8 bits.

When being set to the first selection state, the first decoder 30 selects mutually different two reference voltages VA and VB from the first reference voltage group VX based on a first bit signal group BT1 corresponding to the first range of the video data signal (J1). The first decoder 30 outputs the selected two reference voltages VA and VB as respective first and second selection voltages.

When being set to the second selection state, the first decoder 30 selects the two reference voltages VA and VB including an overlap from the first reference voltage group VX based on the first bit signal group BT1 described above. Here, when the same two reference voltages VA (or VB) are selected, the first decoder 30 outputs the same reference voltages as the first and the second selection voltages. Meanwhile, when the mutually different two reference voltages VA and VB are selected, the first decoder 30 outputs the selected two reference voltages VA and VB as the respective first and the second selection voltages.

The first decoder 30 supplies the above-described first and second selection voltages to the amplifier circuit 20.

When being set to the first selection state, the second decoder 40 selects mutually different two reference voltages VC and VD from the second reference voltage group VZ based on a second bit signal group BT2 corresponding to the second range of the video data signal J1. Then, the second decoder 40 outputs the selected two reference voltages VC and VD as respective third and fourth selection voltages.

When being set to the second selection state, the second decoder 40 selects the same two reference voltages VC (or VD) from the second reference voltage group VZ based on the above-described second bit signal group BT2, and the second decoder 40 outputs the same reference voltages as the third and the fourth selection voltages.

The second decoder 40 supplies the above-described third and fourth selection voltages to the amplifier circuit 20.

The above-described selection voltages VA and VB are preferably a combination of the voltage values adjacent to one another or the voltages having a small difference in voltage value in the first reference voltage group VX. Similarly, the selection voltages VC and VD are preferably a combination of the voltage values adjacent to one another in the second reference voltage group VZ.

Figures 1A, 1B:
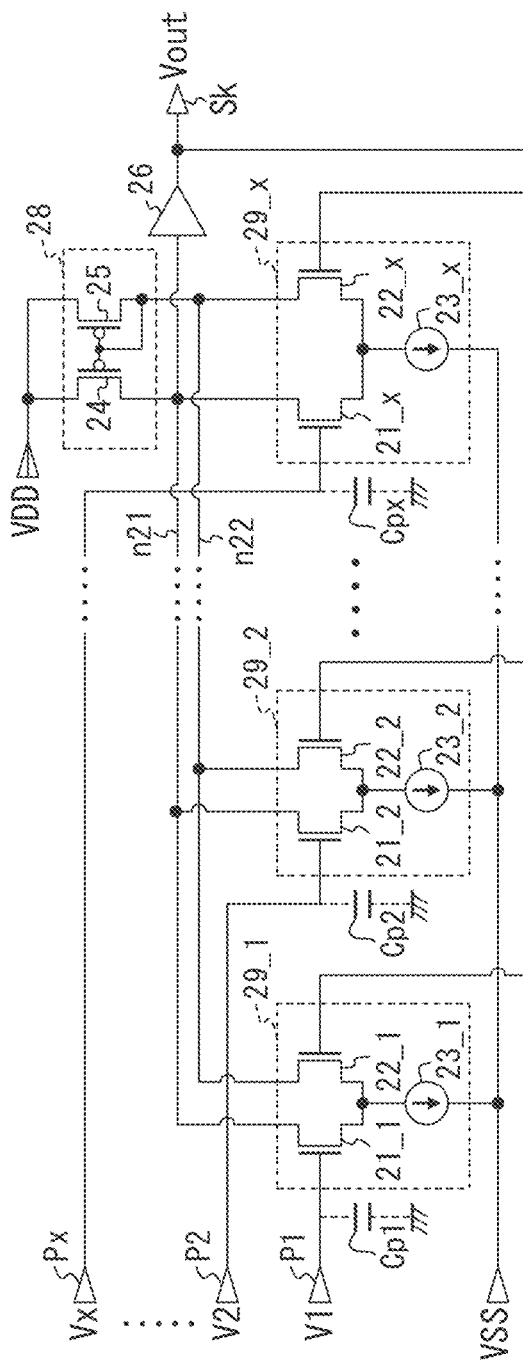
FIG. 1A is a circuit diagram illustrating a configuration of an amplifier circuit to perform an interpolation.
FIG. 1B is a drawing illustrating a relationship between N output ports T1 to TN of a decoder circuit, non-inverting input terminals P1 to Px of the amplifier circuit, and weighting ratios.

The amplifier circuit 20 includes a differential amplifier (operational amplifier) that includes first to N-th terminals T1 to TN (N is an integer of 2 or more) as the non-inverting input terminals and performs the interpolation. For example, the amplifier circuit of FIG. 1A can be used.

The amplifier circuit 20 averages and amplifies N voltages that are each the first selection voltage or the second selection voltage or N voltages that are each the third selection voltage or the fourth selection voltage received by the terminals T1 to TN with the weighting ratios preliminarily set to the respective terminals T1 to TN, and outputs the amplified voltage as the output voltage Vout. The amplifier circuit 20 included in the converter circuit DC1 outputs the output voltage Vout as a driving voltage G1.

In the first selection state described above, the first decoder 30 supplies the above-described first selection voltages (VA) to m (m is an integer of 1 or more) terminal among the terminals T1 to TN of the amplifier circuit 20, and supplies the second selection voltages (VB) to remaining (N−m) terminals. In the second selection state described above, the first decoder 30 supplies the first selection voltage or the second selection voltage (VA or VB) described above to each of the terminals T1 to TN of the amplifier circuit 20. Note that, the second selection state includes a case where the same reference voltages (only one of VA or VB) are supplied to each of the terminals T1 to TN of the amplifier circuit 20 from the first decoder 30.

In the first selection state, the second decoder 40 supplies the above-described third selection voltage (VC) to m terminals among the terminals T1 to TN of the amplifier circuit 20, and supplies the fourth selection voltage (VD) to remaining (N−m) terminals. In the second selection state, the second decoder 40 supplies the third selection voltage and the fourth selection voltage including the same reference voltages (only one of VC or VD) to each of the terminals T1 to TN of the amplifier circuit 20.

That is, to the terminals T1 to TN of the amplifier circuit 20, a first voltage wiring group LV1 that transmits the first and the second selection voltages output from the first decoder 30 and a second voltage wiring group LV2 that transmits the third and the fourth selection voltages output from the second decoder 40 are commonly connected.

The following describes respective operations of the first decoder 30 and the second decoder 40 illustrated in FIG. 5.

FIG. 6 is a drawing illustrating the operation of the first decoder 30 by the first bit signal group BT1 in the video data signal J1 and the operation of the second decoder 40 by the second bit signal group BT2 separately for the first selection state and the second selection state.

In FIG. 6, assume that the control signals (CTL, XCTL) specify the first selection state in the case of, for example, CTL=0 (low level in logical value), and specifies the second selection state in the case of CTL=1 (high level in logical value). The control signal XCTL is a complementary signal of the control signal CTL. The number N of the input terminals of the amplifier circuit 20 and above-described "m" are assumed to m≥1 and N≥2, and the selection voltage is assumed to VA≠VB and VC≠VD.

In the first selection state (CTL=0), the first decoder 30 selects the two different reference voltages VA and VB without an overlap as the first selection voltage VA and the second selection voltage VB from the first reference voltage group VX based on the first bit signal group BT1. The first decoder 30 supplies the first selection voltage VA to m terminals among the terminals T1 to TN of the amplifier circuit 20 and supplies the second selection voltage VB to remaining (N−m) terminals among the terminals T1 to TN.

In the second selection state (CTL=1), the first decoder 30 selects the two reference voltages including an overlap, the voltage VA or VB as the first selection voltage and the voltage VA or VB as the second selection voltage, from the first reference voltage group VX based on the first bit signal group BT1. The first decoder 30 supplies the voltage VA or VB to each of the terminals T1 to TN of the amplifier circuit 20. At this time, the first decoder 30 may selectively supply the voltages VA and VB in mixture to the respective terminals T1 to TN, or may supply only one of the voltages VA and VB to each of the terminals T1 to TN.

In the first selection state (CTL=0), the second decoder 40 selects the two different reference voltages VC and VD without an overlap, the voltage VC as the third selection voltage and the voltage VD as the fourth selection voltage, from the second reference voltage group VZ based on the second bit signal group BT2. The second decoder 40 supplies the third selection voltage VC to m (m is an integer of 1 or more) terminals among the terminals T1 to TN of the amplifier circuit 20 and supplies the fourth selection voltage VD to remaining (N−m) terminals among the terminals T1 to TN.

In the second selection state (CTL=1), the second decoder 40 selects the same reference voltages, the voltage VC or VD as the third selection voltage and the voltage (VC or VD) same as the third selection voltage as the fourth selection voltage, from the second reference voltage group VZ based on the second bit signal group BT2. The second decoder 40 supplies only one of the voltages VC and VD to every terminal of the terminals T1 to TN.

Figure 7:
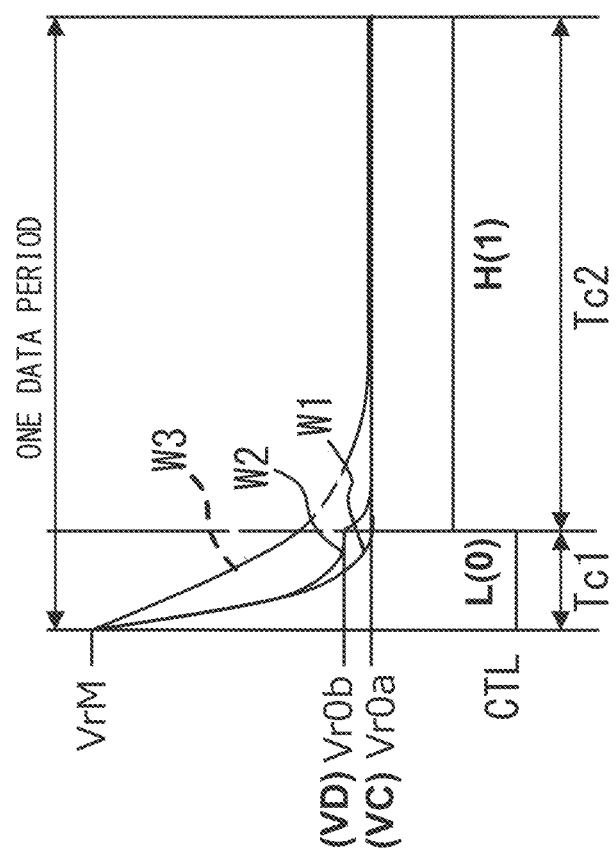
FIG. 7 is a drawing illustrating exemplary waveforms of third and fourth selection voltages supplied to terminals T1 to TN of an amplifier circuit 20 by the second decoder 40 in each of the first selection state and the second selection state.

FIG. 7 is a drawing illustrating exemplary waveforms of the third and the fourth selection voltages supplied to the terminals T1 to TN of the amplifier circuit 20 by the second decoder 40 in each of the first selection state and the second selection state specified by the control signals (CTL, XCTL) in the configuration illustrated in FIG. 5. FIG. 7 illustrates one data period after a reception of the bit signal groups (BT1, BT2) of the video data signal for one pixel by the amplifier circuit 20 until the output of the selection voltage.

As illustrated in FIG. 7, the one data period includes a first-period Tc1 and a second-period Tc2 following the first-period Tc1. In the first-period Tc1, the control signal (CTL, XCTL) is CTL=0 (low level: L), and correspondingly, the second decoder 40 is set to the first selection state. In the second-period Tc2, the control signal (CTL, XCTL) is CTL=1 (high level: H), and correspondingly, the second decoder 40 is set to the second selection state. Since the control signal XCTL is a complementary signal of the control signal CTL, the description will be omitted.

In FIG. 7, solid line waveforms W1 and W2 in the first-period Tc1 are output waveforms of the selection voltages in the first selection state output from the second decoder 40. A dashed line waveform W3 illustrates an output waveform of a conventional decoder, that is, a decoder that keeps the second selection state over the one data period. FIG. 7 illustrates the example of the worst case where all of the n outputs of the data driver perform the same operation in the one data period where the selection voltage is switched from a maximum selection voltage VrM to a minimum selection voltage Vr0a.

The dashed line waveform W3 illustrates the change from the selection voltage VrM selected in the previous one data period to the selection voltage Vr0a in the one data period. The conventional decoder selects the selection voltage Vr0a over the one data period and supplies the selection voltage Vr0a to the terminals T1 to TN of the amplifier circuit 20. The speed of the voltage change of the dashed line waveform W3 depends on a time constant with a resistance of the wiring transmitting the selection voltage Vr0a and an impedance of the decoder itself having an input capacitance (gate parasitic capacitance of the differential pair transistors) of the amplifier circuit as a load.

In this example, in the first-period Tc1 immediately after the start of the one data period, the second decoder 40 is set to the first selection state (CTL=0), and the different two selection voltages (VC, VD)=(Vr0a, Vr0b) are selected as the third and the fourth selection voltages. The selection voltage Vr0b is configured to be, for example, a voltage adjacent to the selection voltage Vr0a, namely for example, a voltage higher than Vr0a by only one stage. The second decoder 40 outputs the selection voltage Vr0a to m terminals among the terminals T1 to TN of the amplifier circuit 20, and supplies the selection voltage Vr0b to (N−m) terminals among the terminals T1 to TN. The solid line waveforms W1 and W2 of the terminals supplied with the selection voltages Vr0a and Vr0b, respectively, indicate the voltage change faster than that of the dashed line waveform W3 caused by decrease of the input capacitance of the amplifier circuit 20 connected to one reference voltage line. The terminals T1 to TN of the amplifier circuit 20 have the predetermined weighting ratios, and the amplifier circuit 20 outputs the voltage between the selection voltages Vr0a and Vr0b, that is, weighted average voltages corresponding to the weighting ratios. As the weighting ratios of the selection voltage Vr0a to Vr0b approaches 1:1, the voltage changes of the waveforms W1 and W2 become close to equivalent, and the voltage changes become fast.

In the second-period Tc2, the second decoder 40 is set to the second selection state (CTL=1), and the selection voltage Vr0a corresponding to the digital signal group is selected as the third and the fourth selection voltages. The second decoder 40 supplies the selection voltage Vr0a to the terminals T1 to TN. For the terminal supplied with the selection voltage Vr0b in the first-period Tc1, while being switched to the supply of the selection voltage Vr0a, the switching is promptly performed because of a small electric potential difference between the selection voltages Vr0a and Vr0b. The selection voltage Vr0a is input to the amplifier circuit 20, and the amplifier circuit 20 amplifies the selection voltage Vr0a and outputs the amplified selection voltage Vr0a.

As described above, this example indicates the example where the one data period is divided into the first-period Tc1 in the first selection state and the second-period Tc2 in the second selection state by the control signals (CTL, XCTL).

In the first selection state (Tc1), the decoders (30, 40) supply selection voltage groups having mutually different voltage values to the amplifier circuit 20. Meanwhile, in the second selection state (Tc2), the decoders supply selection voltage groups having the same voltage value or the mutually different voltage values based on the digital data signal (J1) to the amplifier circuit 20. Accordingly, the change of the input voltage in the amplifier circuit 20 can be accelerated, and in accordance with this, the change speed of the output voltage of the amplifier circuit 20 can be increased. By performing the similar control to every gradation level, the change speeds of the output voltage of the amplifier circuit 20 in the respective gradation levels can be made same.

Figure 8:
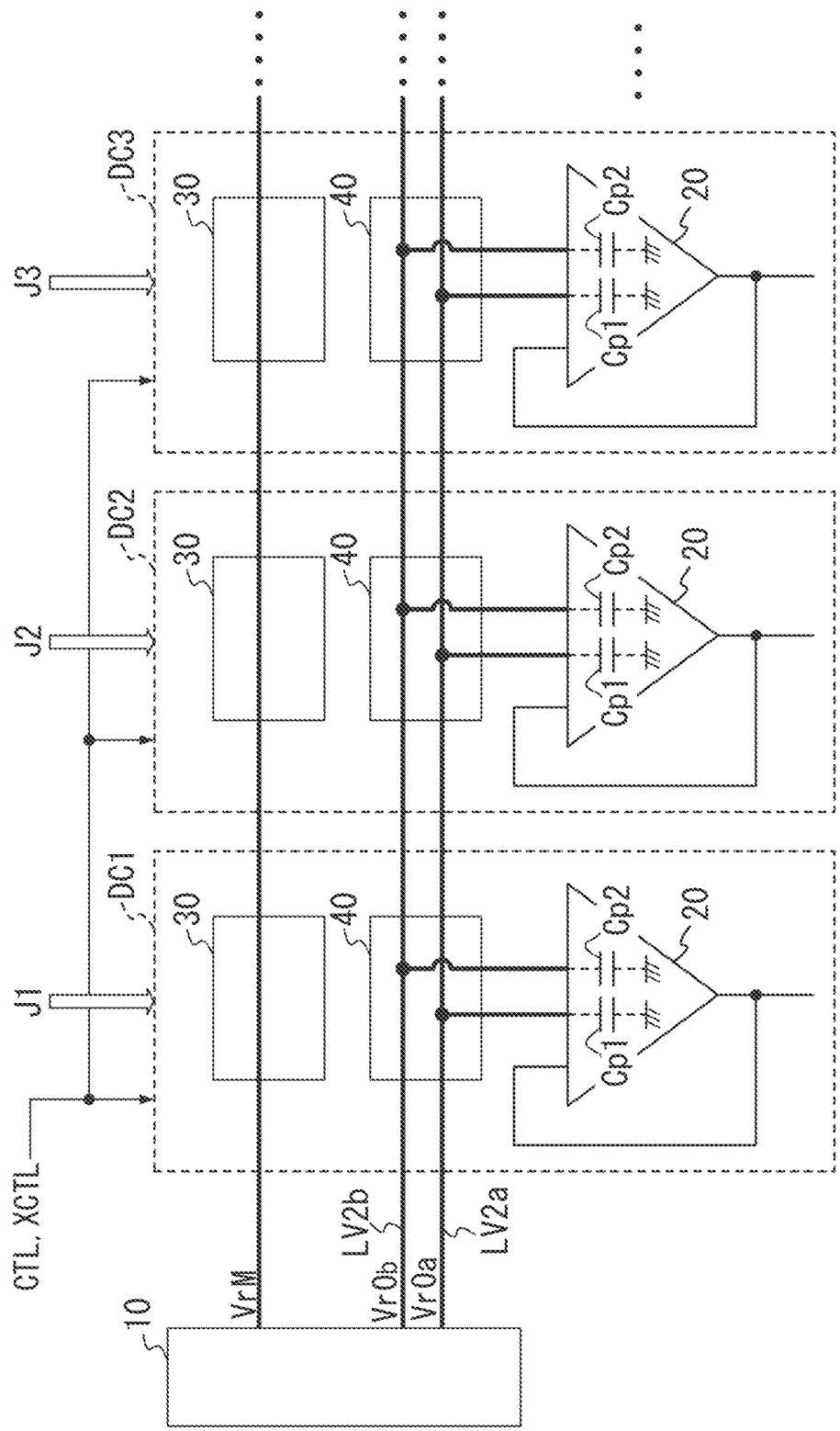
FIG. 8 is a drawing schematically illustrating a state of a reference voltage generation circuit 10, and the first decoders 30 and the second decoders 40 which are included in respective converter circuits in a first-period Tc1 in excerpted converter circuits DC1 to DC3.

The following describes the effects of the data driver 103 that includes the converter circuits DC1 to DCn configured as illustrated in FIG. 5 with an example where the number N of the input terminals of the amplifier circuit 20 and the above-described "m" are assumed to N=2 and m=1, respectively, with reference to FIG. 8.

FIG. 8 is a drawing schematically illustrating a state of the amplifier circuits 20, the first decoders 30, and the second decoders 40, which are included in the respective converter circuits DC1 to DC3 excerpted from the converter circuits DC1 to DCn, and the reference voltage generation circuits 10 in the first-period Tc1.

In the first-period Tc1, the first decoders 30 and the second decoders 40 of the respective converter circuits DC are set to the first selection state. In the example illustrated in FIG. 8, in the first-period Tc1, the second decoders 40 supply the two different selection voltages Vr0a and Vr0b having a small electric potential difference therebetween to the plurality of input terminals of the respective n amplifier circuits 20 corresponding to all the outputs of the data driver 103. A wiring LV2a to which parasitic capacitances Cp1 of the respective input terminals, which receive the selection voltage Vr0a, of the amplifier circuits 20 are connected is a wiring different from a wiring LV2b to which parasitic capacitances Cp2 of the respective input terminals, which receive the selection voltage Vr0b, are connected, that is, the wiring LV2a and the wiring LV2b are wirings not electrically connected to one another. Accordingly, the parasitic capacitances connected to the respective wirings LV2a and LV2b are decreased compared with the case where, in the first-period Tc1, the wiring LV2a or LV2b is connected to both the parasitic capacitances Cp1 and Cp2 parasitized to the respective input terminals of all the amplifier circuits as the conventional decoder, thus increasing the speed of the voltage change of each input terminal in accordance with the decrease. When the voltages received by the input terminals of the respective amplifier circuits sufficiently approach the selection voltages Vr0a, Vr0b in the first-period Tc1, the operation state is returned to the operation state similar to that of the conventional decoder in the second-period Tc2.

Accordingly, even in the worst case where all the input terminals of the n amplifier circuits 20 corresponding to all the outputs are connected to one of the wirings LV2a and LV2b in the second-period Tc2, the change of the input voltage of the amplifier circuit in the one data period can be accelerated. The change speeds of the input voltage of the amplifier circuit in the respective gradation levels can be made same. Consequently, the change of the output voltage of the amplifier circuit can be accelerated to make the speed of the change of the output voltage between the gradations uniform.

Example 2

Figure 9:
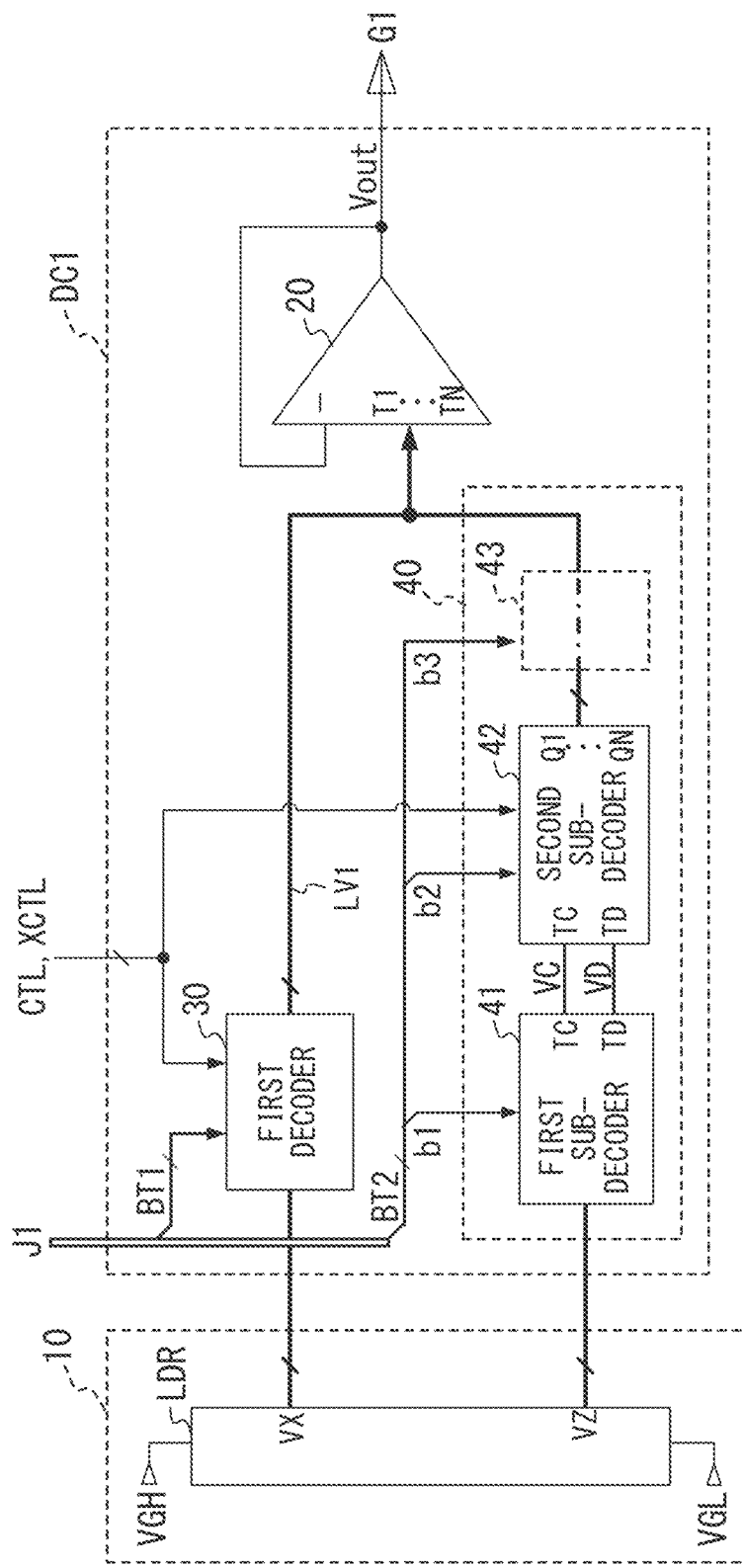
FIG. 9 is a block diagram illustrating another exemplary configuration of the second decoder 40 included in the converter circuit DC.

FIG. 9 is a block diagram illustrating another exemplary configuration of the second decoder 40 included in the converter circuit DC. In FIG. 9, since the reference voltage generation circuit 10, the amplifier circuit 20, and the first decoder 30 included in the DA converter circuit are same as those illustrated in FIG. 5, descriptions for them are omitted.

In the configuration illustrated in FIG. 9, the second bit signal group BT2 is further divided into a first sub-bit signal group b1, a second sub-bit signal group b2, and a third sub-bit signal group b3.

Furthermore, in the configuration illustrated in FIG. 9, the second decoder 40 includes a first sub-decoder 41 that receives the first sub-bit signal group b1 and a second sub-decoder 42 that receives the second sub-bit signal group b2.

The first sub-decoder 41 selects two different selection voltages (VC, VD) without an overlap from the second reference voltage group VZ corresponding to the first sub-bit signal group b1. The first sub-bit signal group b1 includes, for example, a high-order bit group including a most significant bit.

The second sub-decoder 42 selects third and fourth selection voltages including an overlap from the two selection voltages having different voltage values based on the second sub-bit signal group b2 corresponding to the control signals (CTL, XCTL), and supply them to the terminals T1 to TN of the amplifier circuit 20. The second sub-bit signal group b2 includes, for example, a low-order bit group including a least significant bit.

The second decoder 40 may employ a configuration where a filter circuit 43 configured to reduce occurrence of an output short circuit between the first decoder 30 and the second decoder 40 is disposed at a subsequent stage of the second sub-decoder 42. The filter circuit 43 cuts off between an output port of the second sub-decoder 42 and the terminals T1 to TN of the amplifier circuit 20 when a voltage within a selection voltage range (for example, Vup of FIG. 2) assigned to the first decoder 30 is output based on the third sub-bit signal group b3 (for example, including the most significant bit) that specifies the range of the selection voltage. When a voltage within a selection voltage range (for example, Vdw of FIG. 2) assigned to the second decoder 40 is output, the filter circuit 43 conducts electricity between the output port of the second sub-decoder 42 and the terminals T1 to TN of the amplifier circuit 20.

The first sub-decoder 41 may employ a configuration where the first sub-decoder 41 selects two different selection voltages (VC, VD) and outputs them via its own terminals TC and TD. The second sub-decoder 42 employs a configuration where the second sub-decoder 42 receives the selection voltages (VC, VD) of the terminals TC and TD of the first sub-decoder 41 and outputs them via terminals Q1 to QN as output ports. The filter circuit 43 may include a switch group that controls conduction/cutoff between the terminals Q1 to QN of the second sub-decoder 42 and the terminals T1 to TN of the amplifier circuit 20 in one-to-one. The filter circuit 43 may be disposed in the second decoder 40 as illustrated in FIG. 9 or may be disposed in the first decoder 30.

Example 3

FIG. 10A and FIG. 10B are drawings illustrating exemplary operations of the decoders (30, 40) in the above-described second selection state (Tc2) as examples of appropriate specifications for the DA converter circuits (10, DC1) according to the present invention.

FIG. 10A is a drawing illustrating a specification appropriate for a case where the number N of input terminals of the amplifier circuit 20 is N=2, and FIG. 10B illustrates the case of N=3. FIG. 10A and FIG. 10B each illustrate a relationship among the reference voltage Vref selected by the first decoder 30 and the second decoder 40, bit codes (bits D4 to D0) of the data signal, and the selection voltages [V(T1) to V(TN)] input to the terminals T1 to TN of the amplifier circuit 20 in the matching with respective levels indicating the voltage values of the output voltage in stages. The levels 0 to 7 illustrated in FIG. 10A and FIG. 10B correspond to the voltage in the range A, which is inappropriate for the interpolation, of the gamma characteristic curve of FIG. 2, and the level 8 or more corresponds to the voltage in the range B, which is appropriate for the interpolation, of the gamma characteristic curve of FIG. 2. The levels between the adjacent two reference voltages (Vref) in the range B have a linear characteristic by the interpolation of the amplifier circuit. While FIG. 10A and FIG. 10B illustrate the levels to the level 15 and the level 23 for convenience of the drawings, the levels can be further expanded. Extension of the number of levels also increases the number of bits of the corresponding digital data signal.

As illustrated in FIG. 10A and FIG. 10B, when the output voltage is in the range of the levels 0 to 7 at the end of the one data period, the decoder selects the reference voltages having the same voltage value, and supplies the respective reference voltages to the terminals T1 to TN of the amplifier circuit 20 as the selection voltages [V(T1) to V(TN)]. However, while being set to the above-described first selection state (Tc1), the decoder selects the reference voltage corresponding to the level and the reference voltage having the voltage value higher or lower than that of the corresponding reference voltage by only one stage for each level, and supplies the respective reference voltages to the terminals T1 to TN of the amplifier circuit 20 as the selection voltages [V(T1) to V(TN)].

In the specification of FIG. 10A, when the output voltage is the level 8 or more, the decoder selects the same reference voltage for every two stages (for example, the levels 8, 10, 12) as the selection voltages V(T1) and V(T2) supplied to the terminals T1 and T2 of the amplifier circuit 20. For the levels between the levels of every two stages (for example, the levels 9, 11), the decoder selects the two reference voltages selected for the respective two levels adjacent to upper and lower of the level, and outputs them as the selection voltages V(T1) and V(T2). However, while being set to the above-described first selection state (Tc1), the decoder selects the reference voltage corresponding to the level and the reference voltage having the voltage value higher or lower than that of the corresponding reference voltage by only one stage for each level, and supplies the respective reference voltages to the terminals T1 to T2 of the amplifier circuit 20 as the selection voltages [V(T1) to V(T2)].

In the specification of FIG. 10B, when the output voltage is the level 8 or more, the decoder selects the same reference voltage for every four stages (for example, the levels 8, 12, 16) as the selection voltages V(T1) to V(T3) supplied to the terminals T1 to T3 of the amplifier circuit 20 at the end of the one data period. For the levels between the levels of every four stages (for example, the levels 9 to 11, the levels 13 to 15), the decoder selects the two reference voltages selected for the respective two levels adjacent to upper and lower of the level, assigns the two reference voltages to the selection voltages V(T1) to V(T3) corresponding to the bit codes, and outputs them. However, while being set to the above-described first selection state (Tc1), the decoder selects the reference voltage corresponding to the level and the reference voltage having the voltage value higher or lower than that of the corresponding reference voltage by only one stage for each level, assigns the respective reference voltages to the selection voltages [V(T1) to V(T3)] at a predetermined ratio, and supplies them to the terminals T1 to T3 of the amplifier circuit 20.

While in the example described above, the reference voltages selected by the decoder while the decoder is set to the first selection state (Tc1) are the reference voltage corresponding to the level of the output voltage and the reference voltage having the voltage value closest to that of the corresponding reference voltage, the reference voltage is not limited to this.

For example, when the voltage (a present output voltage) output from the amplifier circuit 20 in the present one data period is lower than the voltage (referred to as a previous output voltage) output from the amplifier circuit 20 in the immediately before one data period, the decoder only needs to select the mutually different two reference voltages lower than the previous output voltage over the period where the decoder is set to the first selection state. When the present output voltage is higher than the above-described previous output voltage, the decoder only needs to select the mutually different two reference voltages higher than the previous output voltage over the period where the decoder is set to the first selection state.

In the conventional decoder configuration, in the worst case where the input terminals of the amplifier circuit 20 for all the output are connected to the same wiring, the impedance of the wiring becomes maximum, the voltage changes at the respective inputs of the amplifier circuit 20 are delayed most, thus causing the delay of the change speed of the output voltage of the amplifier circuit 20 in some cases. As illustrated in FIG. 10A and FIG. 10B, the range B includes the gradation levels (for example, even number levels of FIG. 10A) where the input terminals of the amplifier circuit 20 are connected to the same reference voltage wiring, and the gradation levels (for example, odd number levels of FIG. 10A) where the input terminals of the amplifier circuit 20 are connected to the different reference voltage wirings. That is, the impedance of the wiring differs depending on the gradation level to cause the difference between the levels in the speed of the voltage change of each input terminal of the amplifier circuit 20. The difference between the levels in the speed of the voltage change also influences luminance characteristics of the display device corresponding to the gradation level to cause the degradation of the display quality.

In the present invention, by the control where the decoder is switched from the first selection state (first-period Tc1) to the second selection state in the one data period, the voltage change of each input terminal of the amplifier circuit 20 can be accelerated in the first-period Tc1. Accordingly, the present invention can accelerate the change speed of the output voltage of the amplifier circuit 20. In the specifications illustrated in FIG. 10A and FIG. 10B, in the first-period Tc1, at all of the gradation levels in the range A and the range B, the respective input terminals of the amplifier circuit 20 are connected to the different reference voltage wirings, thus reducing the difference between the levels in the speed of the voltage change of each input terminal of the amplifier circuit 20. Accordingly, the degradation of the display quality can be suppressed.

The number N of the input terminals of the amplifier circuit 20 can be expanded. For example, the extension of the specification can be made such that the number N of the terminals is N=4, the weighting ratio of the four terminals T1, T2, T3, and T4 is 1:1:2:4, and the output voltage Vout is Vout=[V(T1)+V(T2)+2×V(T3)+4×V(T4)]/8. In the specification in this case, in the range A, the reference voltage is configured for each gradation level, and the same reference voltage is supplied to the four input terminals of the amplifier circuit 20. In the range B, the reference voltage is configured for every eight levels, and the different two reference voltages are assigned and supplied to the four input terminals of the amplifier circuit 20 corresponding to the bit codes. So, the present invention can also accelerate the change speed of the output voltage of the amplifier circuit 20 with the number N of the input terminals as described above, by the control where the decoder is switched from the first selection state (first-period Tc1) to the second selection state in the one data period.

Example 4

FIG. 11A and FIG. 11B are drawings illustrating exemplary operation configurations in the first selection state and the second selection state by the second decoder 40 illustrated in FIG. 9 when the amplifier circuit 20 includes the two terminals T1 and T2 as the input terminals.

Assume that the DA converter circuit illustrated in FIG. 9 outputs the selection voltages in eight stages of the levels 0 to 7 illustrated in FIG. 10A. This range of the selection voltage is equivalent to, for example, the voltage range Vdw corresponding to the range A, which has the nonlinear characteristic, of the gamma characteristic curve illustrated in FIG. 2. The second sub-decoder 42 receives the two different reference voltages VC and VD selected by the first sub-decoder 41, and controls the selection voltages supplied to the terminals T1 and T2 of the amplifier circuit 20 based on the control signal CTL and the bit D0 as the least significant bit in the digital data signal (J1). The description of the complementary signals XCTL and XD0 of the control signal CTL and the bit D0 are omitted. The weighting ratio of the two terminals T1, T2 of the amplifier circuit 20 is assumed to be set to 1:1.

When being set to the first selection state corresponding to the control signal CTL=0 (low level), the second sub-decoder 42 supplies the mutually different two selection voltages VC and VD to the terminals T1 and T2 of the amplifier circuit 20, respectively as illustrated in FIG. 11A irrespective of the value of the bit D0. At this time, the amplifier circuit 20 receives the selection voltages (VC, VD) at the terminals T1 and T2 with the weighting ratio of 1:1, and outputs the voltage (VC+VD)/2 as the weighted average corresponding to the weighting ratio. Accordingly, in the first selection state, the voltage changes of the terminals T1, T2 are promptly performed.

When being set to the second selection state corresponding to the control signal CTL=1 (high level), the second sub-decoder 42 supplies only the selection voltage VC among the selection voltages VC and VD to each of the terminals T1 and T2 of the amplifier circuit 20 as illustrated in FIG. 11B corresponding to the bit D0=0. The amplifier circuit 20 outputs the voltage VC. Corresponding to the bit D0=1, the second sub-decoder 42 supplies only the selection voltage VD among the selection voltages VC and VD to each of the terminals T1 and T2 of the amplifier circuit 20. The amplifier circuit 20 outputs the voltage VD.

As described above, the first-period Tc1 in the first selection state and the second-period Tc2 in the second selection state are provided in the one data period where the voltage output corresponding to the digital data signal (J1) is performed, and in the first-period Tc1, the voltage change of each input terminal of the amplifier circuit 20 is accelerated even when the voltage change is large. That is, in the initial first-period Tc1, processing to increase the change speed of the output voltage of the amplifier circuit 20 is performed to the voltage corresponding to the digital data signal or the voltage at the proximity of the corresponding voltage, and in the subsequent second-period Tc2, driving is stabilized at the voltage corresponding to the digital data signal.

Figure 12:
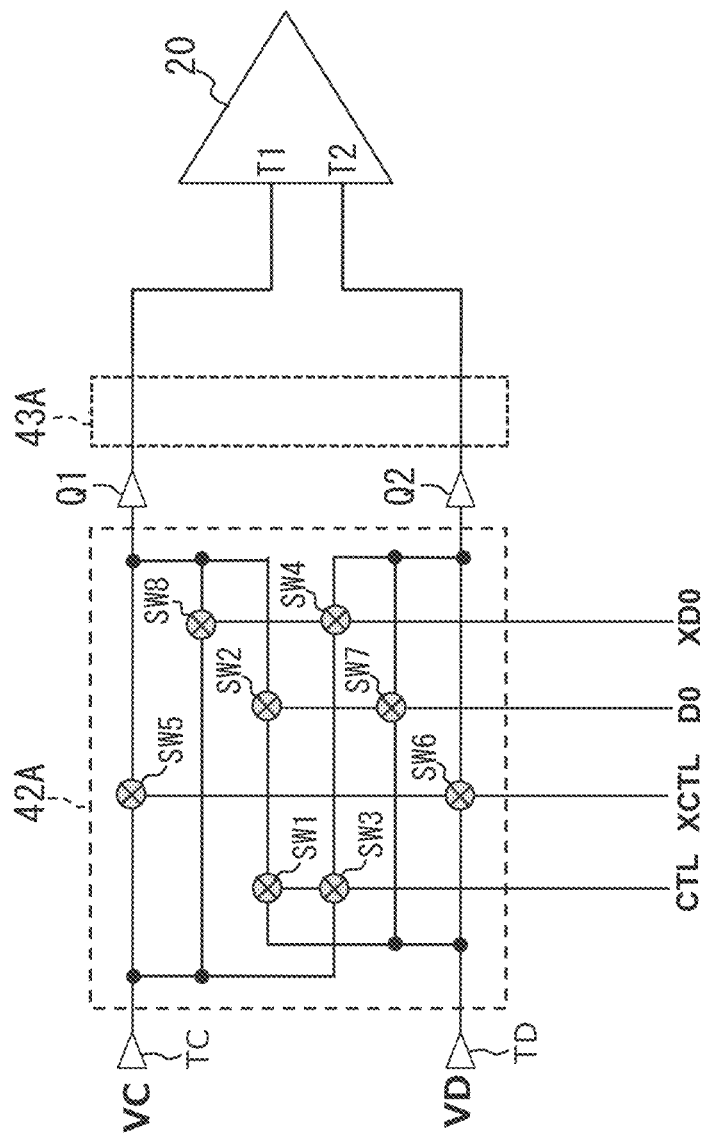
FIG. 12 is a circuit diagram illustrating an exemplary internal configuration of a second sub-decoder 42A as another embodiment of a second sub-decoder 42.

FIG. 12 is a circuit diagram illustrating an exemplary internal configuration of a second sub-decoder 42A configured as the second sub-decoder 42 along the specifications of FIG. 11A and FIG. 11B. The second sub-decoder 42A includes terminals TC and TD that receive mutually different selection voltages VC and VD, Nch transistor switches SW1 to SW8, and terminals Q1 and Q2. A filter circuit 43A is disposed between the terminals Q1 and Q2 and the terminals T1 and T2 of the amplifier circuit 20.

The switch SW1 becomes ON state in the case of the control signal CTL=1 (high level), and supplies the selection voltage VD received by the terminal TD to the switch SW2.

The switch SW2 becomes ON state in the case of the bit D0=1 (high level), and supplies the selection voltage VD supplied from the switch SW1 to the terminal T1 of the amplifier circuit 20 via the terminal Q1 and the filter circuit 43A.

The switch SW3 becomes ON state in the case of the control signal CTL=1 (high level), and supplies the selection voltage VC received by the terminal TC to the switch SW4.

The switch SW4 becomes ON state in the case of an inverted bit XD0=1 (high level), and supplies the selection voltage VC supplied from the switch SW3 to the terminal T2 of the amplifier circuit 20 via the terminal Q2 and the filter circuit 43A.

The switch SW5 becomes ON state in the case of an inverted control signal XCTL=1 (high level), and supplies the selection voltage VC received by the terminal TC to the terminal T1 of the amplifier circuit 20 via the terminal Q1 and the filter circuit 43A.

The switch SW6 becomes ON state in the case of the inverted control signal XCTL=1 (high level), and supplies the selection voltage VD received by the terminal TD to the terminal T2 of the amplifier circuit 20 via the terminal Q2 and the filter circuit 43A.

The switch SW7 becomes ON state in the case of the bit D0=1 (high level), and supplies the selection voltage VD received by the terminal TD to the terminal T2 of the amplifier circuit 20 via the terminal Q2 and the filter circuit 43A.

The switch SW8 becomes ON state in the case of the inverted bit XD0=1 (high level), and supplies the selection voltage VC received by the terminal TC to the terminal T1 of the amplifier circuit 20 via the terminal Q1 and the filter circuit 43A.

The switches SW1 to SW8 may be achieved by Pch transistor switches. That is, the conductivity types of the respective transistors are switched, and respective positive signals of the control signal (CTL) and the bit signal (D0) input to the gates of the respective transistors are switched for complementary signals (XCTL, XD0). The circuit configuration of the second sub-decoder 42A that achieves the specifications of FIG. 11A and FIG. 11B is not limited to the circuit configuration illustrated in FIG. 12. For example, the positions of the respective switches that receive the control signals (CTL, XCTL) and the bit signals (D0, XD0) may be changed.

Example 5

FIG. 13A and FIG. 13B are drawings illustrating exemplary operation configurations of the second decoder 40 illustrated in FIG. 9 in the first selection state and the second selection state when the amplifier circuit 20 includes the three terminals T1 to T3 as the input terminals.

Assume that the DA converter circuit illustrated in FIG. 9 outputs the selection voltages in eight stages of the levels 0 to 7 illustrated in FIG. 10B. This range of the selection voltage equivalents to, for example, the voltage range Vdw corresponding to the range A, which has the nonlinear characteristic, of the gamma characteristic curve illustrated in FIG. 2.

The second sub-decoder 42 receives the two different reference voltages VC and VD selected by the first sub-decoder 41, and controls the selection voltages supplied to the terminals T1 to T3 of the amplifier circuit 20 based on the control signal CTL and the bit D0 as the least significant bit in the digital data signal (J1). The weighting ratio of the three terminals T1 to T3 of the amplifier circuit 20 is assumed to be set to 1:1:2.

When being set to the first selection state corresponding to the control signal CTL=0 (low level), the second sub-decoder 42 supplies one selection voltage VC of the selection voltages VC and VD to each of the terminals T1 and T2 of the amplifier circuit 20 as illustrated in FIG. 13A irrespective of the value of the bit D0. Further, the second sub-decoder 42 supplies the other selection voltage VD of the selection voltages VC and VD to the terminal T3 of the amplifier circuit 20 as illustrated in FIG. 13A. At this time, the amplifier circuit 20 receives the selection voltage VC at the terminals T1 and T2, receives the selection voltage VD at the terminal T3, and outputs the voltage (VC+VD)/2 as the weighted average of the selection voltages VC and VD with the weighting ratio of 1:1. Accordingly, in the first selection state, the voltage changes of the terminals T1 to T3 are promptly performed.

When being set to the second selection state corresponding to the control signal CTL=1 (high level), the second sub-decoder 42 supplies the selection voltage VC to each of the terminals T1 to T3 of the amplifier circuit 20 as illustrated in FIG. 13B corresponding to the bit D0=0. The amplifier circuit 20 outputs the voltage VC. Corresponding to the bit D0=1, the second sub-decoder 42 supplies the selection voltage VD to each of the terminals T1 to T3 of the amplifier circuit 20. The amplifier circuit 20 outputs the voltage VD.

As described above, the first-period Tc1 in the first selection state and the second-period Tc2 in the second selection state are provided in the one data period where the voltage output corresponding to the digital data signal (J1) is performed, and in the first-period Tc1, the voltage change of each input terminal of the amplifier circuit 20 is accelerated even when the voltage change is large. That is, in the initial first-period Tc1, processing to increase the change speed of the output voltage of the amplifier circuit 20 is performed to the voltage corresponding to the digital data signal or the voltage at the proximity of the corresponding voltage, and in the subsequent second-period Tc2, driving is stabilized at the voltage corresponding to the digital data signal.

Figure 14:
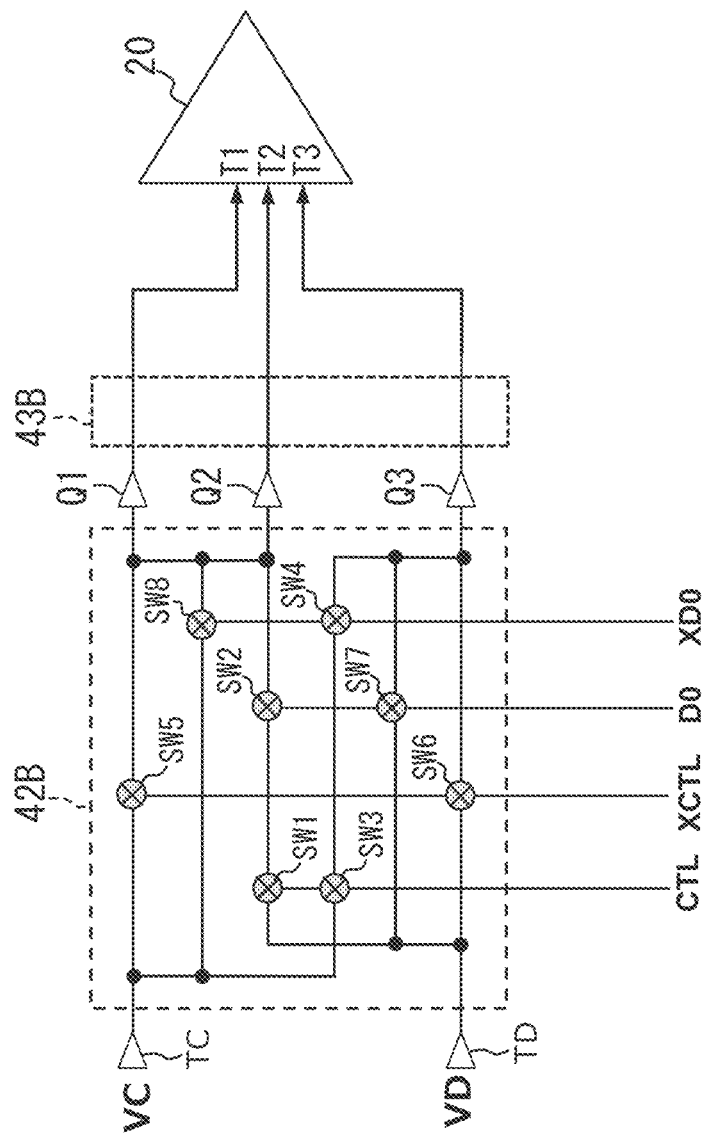
FIG. 14 is a circuit diagram illustrating an exemplary internal configuration of a second sub-decoder 42B as another embodiment of the second sub-decoder 42.

FIG. 14 is a circuit diagram illustrating an exemplary internal configuration of a second sub-decoder 42B configured as the second sub-decoder 42 along the specifications of FIG. 13A and FIG. 13B. The second sub-decoder 42B includes terminals TC and TD that receive mutually different selection voltages VC and VD, Nch transistor switches SW1 to SW8, and terminals Q1 to Q3. A filter circuit 43B is disposed between the terminals Q1 to Q3 and the terminals T1 to T3 of the amplifier circuit 20.

The switch SW1 becomes ON state in the case of the control signal CTL=1 (high level), and supplies the selection voltage VD received by the terminal TD to the switch SW2.

The switch SW2 becomes ON state in the case of the bit D0=1 (high level), and supplies the selection voltage VD supplied from the switch SW1 to the terminals T1 and T2 of the amplifier circuit 20 via the terminals Q1, Q2, and the filter circuit 43B.

The switch SW3 becomes ON state in the case of the control signal CTL=1 (high level), and supplies the selection voltage VC received by the terminal TC to the switch SW4.

The switch SW4 becomes ON state in the case of an inverted bit XD0=1 (high level), and supplies the selection voltage VC supplied from the switch SW3 to the terminal T3 of the amplifier circuit 20 via the terminal Q3 and the filter circuit 43B.

The switch SW5 becomes ON state in the case of an inverted control signal XCTL=1 (high level), and supplies the selection voltage VC received by the terminal TC to the terminals T1 and T2 of the amplifier circuit 20 via the terminals Q1, Q2, and the filter circuit 43B.

The switch SW6 becomes ON state in the case of the inverted control signal XCTL=1 (high level), and supplies the selection voltage VD received by the terminal TD to the terminal T3 of the amplifier circuit 20 via the terminal Q3 and the filter circuit 43B.

The switch SW7 becomes ON state in the case of the bit D0=1 (high level), and supplies the selection voltage VD received by the terminal TD to the terminal T3 of the amplifier circuit 20 via the terminal Q3 and the filter circuit 43B.

The switch SW8 becomes ON state in the case of the inverted bit XD0=1 (high level), and supplies the selection voltage VC received by the terminal TC to the terminals T1 and T2 of the amplifier circuit 20 via the terminals Q1, Q2, and the filter circuit 43B.

The switches SW1 to SW8 illustrated in FIG. 14 may be achieved by Pch transistor switches. That is, the conductivity types of the respective transistors are switched, and respective positive signals of the control signal (CTL) and the bit signal (D0) input to the gates of the respective transistors are switched for complementary signals (XCTL, XD0). The circuit configuration of the second sub-decoder 42B that achieves the specifications of FIG. 13A and FIG. 13B is not limited to the circuit configuration illustrated in FIG. 14. For example, the positions of the respective switches that receive the control signals (CTL, XCTL) and the bit signals (D0, XD0) may be changed.

Example 6

Figure 15:
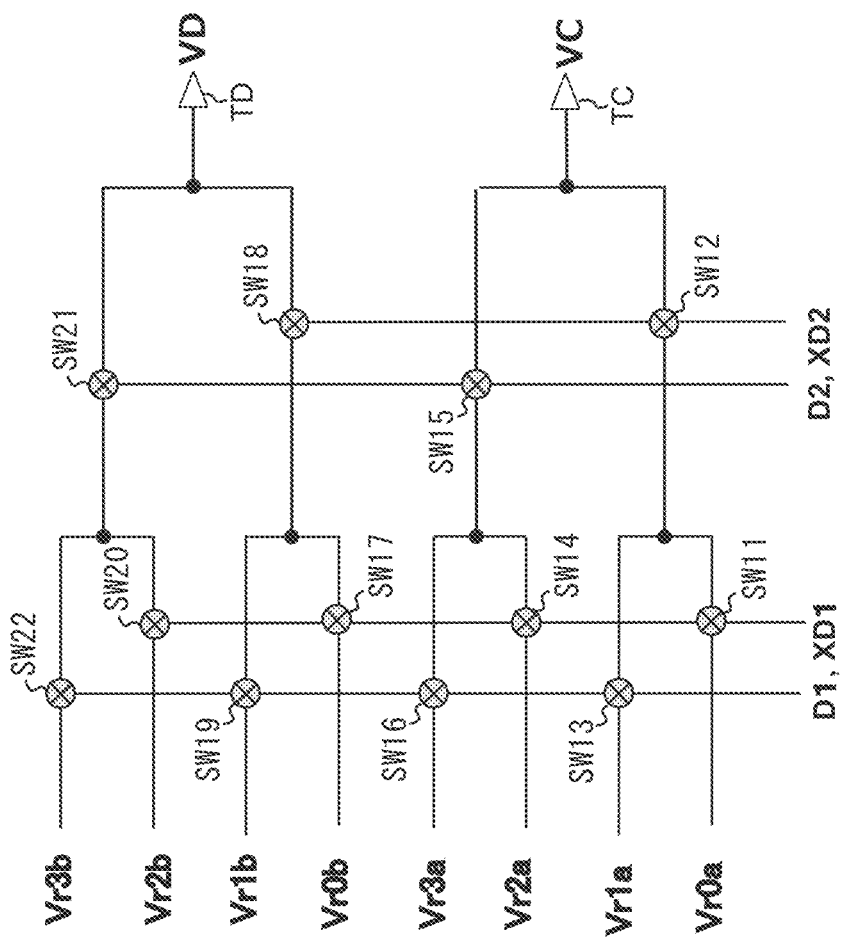
FIG. 15 is a circuit diagram illustrating a configuration of an output unit that outputs selection voltages of levels 0 to 7 illustrated in FIG. 10A and FIG. 10B in the first sub-decoder 41.

FIG. 15 is a circuit diagram illustrating a configuration of an output unit that outputs the selection voltages of the levels 0 to 7 illustrated in FIG. 10A and FIG. 10B in the first sub-decoder 41.

The first sub-decoder 41 receives eight reference voltages Vr0a, Vr0b, Vr1a, Vr1b, Vr2a, Vr2b, Vr3a, and Vr3b corresponding to the levels 0 to 7, respectively, and a bit D2, an inverted bit XD2, a bit D1, and an inverted bit XD1 as the first sub-bit signal group b1. As illustrated in FIG. 15, the first sub-decoder 41 includes Nch transistor switches SW11 to SW22 and terminals TC and TD as the output ports.

The switch SW11 becomes ON state in the case of the inverted bit XD1=1 (high level), and supplies the reference voltage Vr0a to the switch SW12. The switch SW13 becomes ON state in the case of the bit D1=1 (high level), and supplies the reference voltage Vr1a to the switch SW12. The switch SW12 becomes ON state in the case of the inverted bit XD2=1 (high level), and outputs one of the reference voltage Vr0a supplied from the switch SW11 and the reference voltage Vr1a supplied from the switch SW13 as the selection voltage VC via the terminal TC.

The switch SW14 becomes ON state in the case of the inverted bit XD1=1 (high level), and supplies the reference voltage Vr2a to the switch SW15. The switch SW16 becomes ON state in the case of the bit D1=1 (high level), and supplies the reference voltage Vr3a to the switch SW15. The switch SW15 becomes ON state in the case of the bit D2=1 (high level), and outputs one of the reference voltage Vr2a supplied from the switch SW14 and the reference voltage Vr3a supplied from the switch SW16 as the selection voltage VC via the terminal TC.

The switch SW17 becomes ON state in the case of the inverted bit XD1=1 (high level), and supplies the reference voltage Vr0b to the switch SW18. The switch SW19 becomes ON state in the case of the bit D1=1 (high level), and supplies the reference voltage Vr1b to the switch SW18. The switch SW18 becomes ON state in the case of the inverted bit XD2=1 (high level), and outputs one of the reference voltage Vr0b supplied from the switch SW17 and the reference voltage Vr1b supplied from the switch SW19 as the selection voltage VD via the terminal TD.

The switch SW20 becomes ON state in the case of the inverted bit XD1=1 (high level), and supplies the reference voltage Vr2b to the switch SW21. The switch SW22 becomes ON state in the case of the bit D1=1 (high level), and supplies the reference voltage Vr3b to the switch SW21. The switch SW21 becomes ON state in the case of the bit D2=1 (high level), and outputs one of the reference voltage Vr2b supplied from the switch SW20 and the reference voltage Vr3b supplied from the switch SW22 as the selection voltage VD via the terminal TD.

With this configuration, the first sub-decoder 41 selects one of the reference voltages Vr0a, Vr1a, Vr2a, and Vr3a corresponding to the even number gradations as the selection voltage VC corresponding to the first sub-bit signal group b1 (D2, XD2, D1, XD1). Further, the first sub-decoder 41 selects one of the reference voltages Vr0b, Vr1b, Vr2b, and Vr3b corresponding to the odd number gradations as the selection voltage VD. For the selection voltages VC and VD, the reference voltages adjacent to one another having a small electric potential difference between both reference voltages are preferred to be selected. Accordingly, the change amount of the output voltage of the amplifier circuit 20 can be decreased at the time of switch from the first-period Tc1 to the second-period Tc2 in the one data period to ensure a smooth waveform of the output voltage.

While the circuit of the first sub-decoder 41 illustrated in FIG. 15 includes a minimum number of transistor switches, a configuration where the order of selection based on the bits D1 and D2 is switched may be employed. Furthermore, the size of the range A of FIG. 10A and FIG. 10B is also changeable as necessary.

Example 7

Figures 16A, 16B:
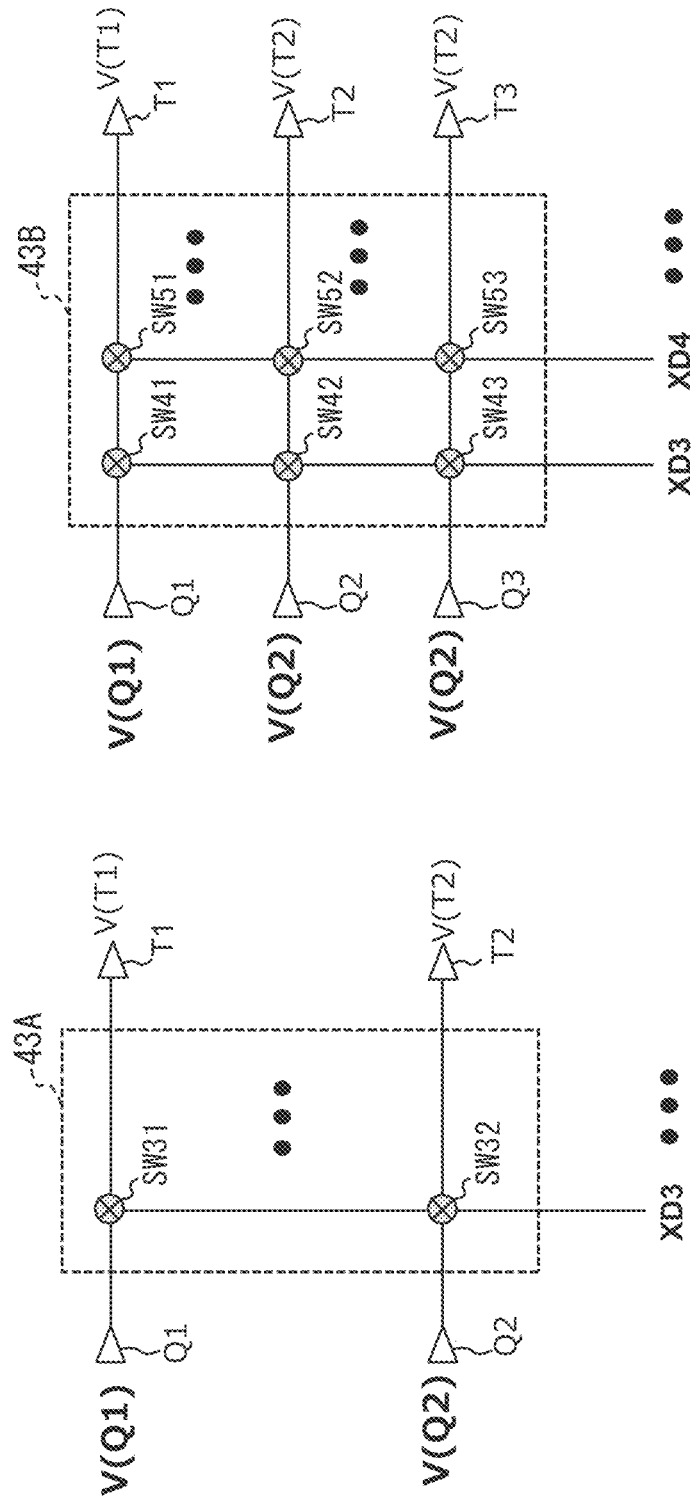
FIG. 16A is a circuit diagram illustrating a configuration of a filter circuit 43 when the number of the input terminals of the amplifier circuit 20 is two.
FIG. 16B is a circuit diagram illustrating a configuration of the filter circuit 43 when the number of the input terminals of the amplifier circuit 20 is three.

FIG. 16A and FIG. 16B are circuit diagrams illustrating specific examples of the filter circuit 43 described above.

FIG. 16A is a diagram illustrating a circuit of the filter circuit 43A when the number N of the input terminals of the amplifier circuit 20 is N=2, and FIG. 16B is a diagram illustrating a circuit of the filter circuit 43B when the number N of the input terminals of the amplifier circuit 20 is N=3.

The filter circuit 43A or 43B is disposed to avoid occurrence of unexpected short circuit between the outputs of the first decoder 30 and the second decoder 40, and disposed to any one of the first decoder 30 and the second decoder 40. In this example, the operation is described with a configuration where the filter circuit 43A or 43B is disposed to the second decoder 40.

The filter circuit 43A illustrated in FIG. 16A is disposed between the terminals Q1 and Q2 as the output ports of the second sub-decoder 42A and the terminals T1 and T2 of the amplifier circuit 20 illustrated in FIG. 12.

The circuit illustrated in FIG. 16A includes Nch transistor switches SW31 and SW32.

The switch SW31 becomes ON state in the case of an inverted bit XD3=1 (high level), where the inverted bit XD3 is obtained by inverting a logic level of the bit D3 as the third sub-bit signal group b3, and the switch SW31 electrically connects the terminal Q1 of the second sub-decoder 42A to the terminal T1 of the amplifier circuit 20. In the case of the inverted bit XD3=0 (low level), the switch SW31 becomes OFF state, and cuts off the electrical connection between the terminal Q1 and the terminal T1.

The switch SW32 becomes ON state in the case of the inverted bit XD3=1 (high level), and electrically connects the terminal Q2 of the second sub-decoder 42A to the terminal T2 of the amplifier circuit 20. Meanwhile, in the case of the inverted bit XD3=0 (low level), the switch SW32 becomes OFF state, and cuts off the electrical connection between the terminal Q2 and the terminal T2.

With this configuration, the filter circuit 43A illustrated in FIG. 16A establishes a conduction between the output ports (Q1, Q2) of the second sub-decoder 42A and the input terminals (T1, T2) of the amplifier circuit 20 only when the level of the digital data signal is in the range A indicated in the specification of FIG. 10A, and cuts off the conduction when the level of the digital data signal is out of the range A.

Instead of the filter circuit 43A, another filter circuit that connects the second sub-decoder 42A to the amplifier circuit 20 only when the bit value is in the range B may be disposed between the output of the first decoder 30 and the input terminal of the amplifier circuit 20.

The filter circuit 43B illustrated in FIG. 16B is disposed between the terminals Q1 to Q3 as the output ports of the second sub-decoder 42B illustrated in FIG. 14 and the terminals T1 to T3 of the amplifier circuit 20.

The circuit illustrated in FIG. 16B includes Nch transistor switches SW41 to SW43, and SW51 to 53.

The switches SW41 to SW43 become ON state in the case of an inverted bit XD3=1 (high level), where the inverted bit XD3 is obtained by inverting a logic level of the bit D3 as the third sub-bit signal group b3, and become OFF state in the case of the inverted bit XD3=0 (low level). The switches SW51 to SW53 become ON state in the case of an inverted bit XD4=1 (high level), where the inverted bit XD4 is obtained by inverting a logic level of the bit D4 as the third sub-bit signal group b3, and become OFF state in the case of the inverted bit XD4=0 (low level).

When both the switches SW41 and SW51 become ON state, the terminal Q1 of the second sub-decoder 42B is electrically connected to the terminal T1 of the amplifier circuit 20, and when any one of them becomes OFF state, the connection between the terminal Q1 and the terminal T1 is cut off. When both the switches SW42 and SW52 become ON state, the terminal Q2 of the second sub-decoder 42B is electrically connected to the terminal T2 of the amplifier circuit 20, and when any one of them becomes OFF state, the connection between the terminal Q2 and the terminal T2 is cut off. Furthermore, when both the switches SW43 and SW53 become ON state, the terminal Q3 of the second sub-decoder 42B is electrically connected to the terminal T3 of the amplifier circuit 20, and when any one of them becomes OFF state, the connection between the terminal Q3 and the terminal T3 is cut off.

With this configuration, the filter circuit 43B illustrated in FIG. 16B establishes a conduction between the output ports (Q1 to Q3) of the second sub-decoder 42B and the input terminals (T1 to T3) of the amplifier circuit 20 only when the level of the digital data signal is in the range A indicated in the specification of FIG. 10B, and cuts off the conduction when the level of the digital data signal is out of the range A.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2019-45062 filed on Mar. 12, 2019, the entire contents of which are incorporated herein by reference.

What is claimed is:

1. A digital-to-analog converter circuit comprising:
    a reference voltage generation circuit that generates a plurality of reference voltages having mutually different voltage values and outputs a first reference voltage group corresponding to a first range and a second reference voltage group corresponding to a second range from the plurality of reference voltages;
    a first decoder operated according to any one of a plurality of selection states that receives a first bit group in a digital data signal of t (t is an integer of 2 or more) bits, selects mutually different first two reference voltages from the first reference voltage group based on the first bit group and outputs the first two reference voltages as first and second selection voltages when the first decoder is set to a first selection state of the plurality of selection states, the digital data signal including the first bit group and a second bit group;
    a second decoder operated according to any one of the plurality of selection states that receives the second bit group in the digital data signal, selects mutually different second two reference voltages from the second reference voltage group based on the second bit group and outputs the second two reference voltages as third and fourth selection voltages when the second decoder is set to the first selection state; and
    an amplifier circuit that outputs a voltage as an output voltage, the voltage being different based on each of the plurality of selection states and obtained by averaging a plurality of voltages with predetermined weighting ratios and amplifying the averaged voltages, the plurality of voltages being each the first selection voltage or the second selection voltage, or the plurality of voltages being each the third selection voltage or the fourth selection voltage.

2. The digital-to-analog converter circuit according to claim 1, wherein
    the first decoder selects third two reference voltages including an overlap from the first reference voltage group based on the first bit group and outputs the third two reference voltages as the first and the second selection voltages when the first decoder is set to a second selection state of the plurality of selection states, and
    the second decoder selects one reference voltage from the second reference voltage group based on the second bit group and outputs the one voltage as the third and the fourth selection voltages when the second decoder is set to the second selection state.

3. The digital-to-analog converter circuit according to claim 2, wherein the amplifier circuit includes first to N-th (N is an integer of 2 or more) input terminals, the amplifier circuit receives N selection voltages that are each the first selection voltage or the second selection voltage or N selection voltages that are each the third selection voltage or the fourth selection voltage by the first to N-th input terminals, the amplifier circuit outputs a voltage as the output voltage, and the voltage is obtained by averaging the N selection voltages with a weighting ratio set to each of the first to N-th input terminals and amplifying the averaged voltages, the first decoder supplies the first selection voltage to m (m is positive number of 1 or more) terminals among the first to N-th terminals and supplies the second selection voltage to remaining (N−m) terminals among the first to N-th terminals when the first decoder is set to the first selection state, and the first decoder supplies the first selection voltage or the second selection voltage to each of the first to N-th terminals when the first decoder is set to the second selection state, and the second decoder supplies the third selection voltage to m terminals among the first to N-th terminals and supplies the fourth selection voltage to remaining (N−m) terminals among the first to N-th terminals when the second decoder is set to the first selection state, and the second decoder supplies the third selection voltage or the fourth selection voltage to each of the first to N-th terminals when the second decoder is set to the second selection state.

4. A data driver comprising
a digital-to-analog converter unit that receives a video data signal and converts the video data signal into a driving voltage to supply the driving voltage to a display device, the video data signal indicating a luminance level by t (t is an integer of 2 or more) bits including a first bit group and a second bit group, the driving voltage having a voltage value with a magnitude corresponding to the luminance level, wherein
the digital-to-analog converter unit includes:
    a reference voltage generation circuit that generates a plurality of reference voltages having mutually different voltage values and outputs a first reference voltage group corresponding to a first range and a second reference voltage group corresponding to a second range from the plurality of reference voltages;
    a first decoder operated according to any one of a plurality of selection states that receives a first bit group in a digital data signal of t (t is an integer of 2 or more) bits, selects mutually different first two reference voltages from the first reference voltage group based on the first bit group and outputs the first two reference voltages as first and second selection voltages when the first decoder is set to a first selection state of the plurality of selection states, the digital data signal including the first bit group and a second bit group;
    a second decoder operated according to any one of the plurality of selection states that receives the second bit group in the digital data signal, selects mutually different second two reference voltages from the second reference voltage group based on the second bit group and outputs the second two reference voltages as third and fourth selection voltages when the second decoder is set to the first selection state; and an amplifier circuit that outputs a voltage as an output voltage, the voltage being different based on each of the plurality of selection states and obtained by averaging a plurality of voltages with predetermined weighting ratios and amplifying the averaged voltages, the plurality of voltages being each the first selection voltage or the second selection voltage, or the plurality of voltages being each the third selection voltage or the fourth selection voltage.

\* \* \* \* \*